United States Patent
Bang

(10) Patent No.: US 9,842,764 B2
(45) Date of Patent: Dec. 12, 2017

(54) DISPLAY DEVICE USING SEMICONDUCTOR LIGHT EMITTING DEVICES AND METHOD FOR MANUFACTURING THE SAME

(71) Applicant: LG Electronics Inc., Seoul (KR)

(72) Inventor: Kyuhyun Bang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 14/868,072

(22) Filed: Sep. 28, 2015

(65) Prior Publication Data

US 2016/0218142 A1    Jul. 28, 2016

(30) Foreign Application Priority Data

Jan. 27, 2015    (KR) ..................... 10-2015-0012977

(51) Int. Cl.
- *H01L 27/32* (2006.01)
- *H01L 21/768* (2006.01)
- *H01L 23/00* (2006.01)
- *H01L 25/075* (2006.01)
- *H01L 33/62* (2010.01)

(52) U.S. Cl.
CPC ............ *H01L 21/768* (2013.01); *H01L 24/95* (2013.01); *H01L 25/0753* (2013.01); *H01L 33/62* (2013.01); *H01L 2224/24* (2013.01); *H01L 2924/0002* (2013.01)

(58) Field of Classification Search
CPC .......................... H01L 27/156; H01L 27/3255
See application file for complete search history.

(56) References Cited

U.S. PATENT DOCUMENTS

2006/0181195 A1* 8/2006 Oikawa ............... G09G 3/006
                                                 313/498
2015/0009713 A1    1/2015 Yang et al.
2015/0115296 A1    4/2015 Rhee et al.
2015/0116985 A1    4/2015 Bang
(Continued)

FOREIGN PATENT DOCUMENTS

KR    10-2014-0030887 A    3/2014
KR    10-1422037 B1    7/2014
(Continued)

*Primary Examiner* — Peniel M Gumedzoe
*Assistant Examiner* — Christopher Johnson
(74) *Attorney, Agent, or Firm* — Birch, Stewart, Kolasch & Birch, LLP

(57) ABSTRACT

A display device including a plurality of semiconductor light emitting devices on a wiring substrate; a connection part on the wiring substrate and configured to electrically-connect the plurality of semiconductor light emitting devices to the wiring substrate. Further, each of the plurality of semiconductor light emitting devices includes a first conductive semiconductor layer; a second conductive semiconductor layer overlapped with the first conductive semiconductor layer; a first conductive electrode on the first conductive semiconductor layer; and a second conductive electrode on the second conductive semiconductor layer. In addition, the connection part includes a first conductive layer formed of a same material as the first conductive electrode and a second conductive layer formed of a same material as the second conductive electrode.

19 Claims, 18 Drawing Sheets

(56) References Cited

U.S. PATENT DOCUMENTS

2015/0221619 A1    8/2015   Rhee
2015/0228865 A1    8/2015   Rhee
2016/0043061 A1    2/2016   Rhee

FOREIGN PATENT DOCUMENTS

| KR | 10-1452768 B1 | 10/2014 |
| KR | 10-1476686 B1 | 12/2014 |
| KR | 10-1476687 B1 | 12/2014 |
| KR | 10-1476688 B1 | 12/2014 |
| KR | 10-2015-0005128 A | 1/2015 |

* cited by examiner

DISPLAY DEVICE USING SEMICONDUCTOR LIGHT EMITTING DEVICES AND METHOD FOR MANUFACTURING THE SAME

CROSS-REFERENCE TO RELATED APPLICATION

Pursuant to 35 U.S.C. §119(a), this application claims the benefit of earlier filing date and right of priority to Korean Application No. 10-2015-0012977, filed on Jan. 27, 2015, the contents of which is incorporated by reference herein in its entirety.

BACKGROUND OF THE INVENTION

1. Field of the Invention

The present invention relates to a display device and a method for manufacturing the same, and more particularly, to a flexible display device using semiconductor light emitting devices.

2. Background of the Invention

Display devices have excellent characteristics such as a low profile, flexibility and the like. Further, currently commercialized main displays are represented by liquid crystal displays (LCDs) and active matrix organic light emitting diodes (AMOLEDs). However, there exist problems such as a slow response time, difficult implementation of flexibility for LCDs, and there exist drawbacks such as a short life span, poor yield as well as low flexibility for AMOLEDs.

Further, light emitting diodes (LEDs) have been used as a light source for displaying an image in an electronic device including information communication devices since red LEDs using GaAsP compound semiconductors were made commercially available in 1962, together with a GaP:N-based green LEDs. Accordingly, the semiconductor light emitting devices may be used to implement a flexible display.

SUMMARY OF THE INVENTION

Therefore, an aspect of the detailed description is to provide a structure and a method capable of simplifying wiring processes in a novel flexible display device.

Another aspect of the detailed description is to provide a display device having a connection wiring structure, capable of reducing a thickness thereof.

To achieve these and other advantages and in accordance with the purpose of this specification, as embodied and broadly described herein, the present invention provides a display device including a plurality of semiconductor light emitting devices on a wiring substrate; and a connection part on the wiring substrate and configured to electrically-connect the plurality of semiconductor light emitting devices to the wiring substrate. Further, each of the plurality of semiconductor light emitting devices includes a first conductive semiconductor layer; a second conductive semiconductor layer overlapped with the first conductive semiconductor layer; a first conductive electrode on the first conductive semiconductor layer; and a second conductive electrode on the second conductive semiconductor layer. In addition, the connection part includes a first conductive layer formed of a same material as the first conductive electrode and a second conductive layer formed of a same material as the second conductive electrode. The present invention also provides a corresponding method of manufacturing the display device.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

In the drawings.

DETAILED DESCRIPTION OF THE INVENTION

Figure 1:
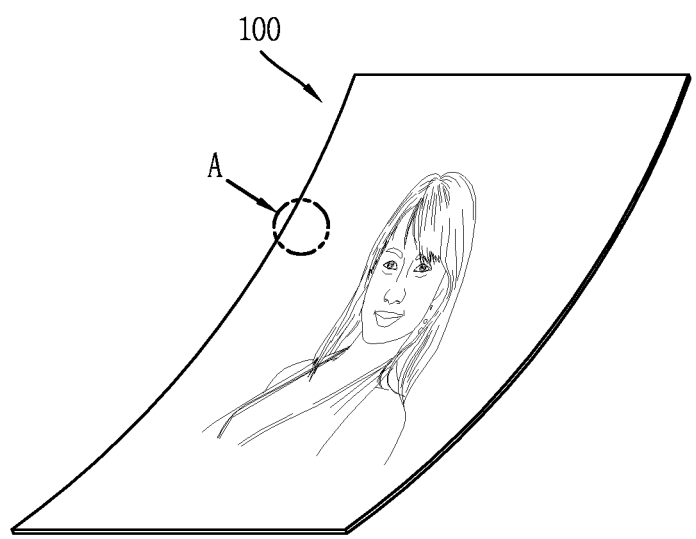
FIG. 1 is a conceptual view illustrating an embodiment of a display device using a semiconductor light emitting device according to an embodiment of the present invention.

Hereinafter, the embodiments disclosed herein will be described in detail with reference to the accompanying drawings, and the same or similar elements are designated with the same numeral references regardless of the numerals in the drawings and their redundant description will be omitted. A suffix "module" or "unit" used for constituent elements disclosed in the following description is merely intended for easy description of the specification, and the suffix itself does not give any special meaning or function.

Also, it should be noted that the accompanying drawings are merely illustrated to easily explain the concept of the invention, and therefore, they should not be construed to limit the technological concept disclosed herein by the accompanying drawings. Furthermore, when an element such as a layer, region or substrate is referred to as being "on" another element, it can be directly on the another element or an intermediate element may also be interposed therebetween.

A display device disclosed herein may include a portable phone, a smart phone, a laptop computer, a digital broadcast terminal, a personal digital assistant (PDA), a portable multimedia player (PMP), a navigation, a slate PC, a tablet PC, an ultrabook, a digital TV, a desktop computer, and the like. However, a configuration disclosed herein may be applicable to any displayable device even though it is a new product type which will be developed later.

FIG. 1 is a conceptual view illustrating a display device 100 using a semiconductor light emitting device according to an embodiment of the present disclosure. As shown in FIG. 1, information processed in the controller of the display device 100 can be displayed using a flexible display. The flexible display includes a flexible, bendable, twistable, foldable and rollable display. For example, the flexible display can be fabricated on a thin and flexible substrate that can be warped, bent, folded or rolled like a paper sheet while maintaining the display characteristics of a flat display.

A display area of the flexible display becomes a plane when the flexible display is not warped (for example, a configuration having an infinite radius of curvature, hereinafter, referred to as a "first configuration"). The display area thereof becomes a curved surface when the flexible display is warped by an external force in the first configuration (for example, a configuration having a finite radius of curvature, hereinafter, referred to as a "second configuration"). As illustrated in FIG. 1, information displayed in the second configuration includes visual information displayed on a curved surface.

The visual information may be implemented by individually controlling the light emission of sub-pixels disposed in a matrix form. Further, the sub-pixel denotes a minimum unit for implementing one color, and may be implemented by a semiconductor light emitting device. According to an embodiment of the present disclosure, a light emitting diode (LED) is illustrated as a type of semiconductor light emitting device. The light emitting diode can be formed with a small size to perform the role of a sub-pixel even in the second configuration.

Hereinafter, a flexible display implemented using the light emitting diode will be described in more detail with reference to the accompanying drawings. In particular, FIG. 2 is a partial enlarged view of portion "A" in FIG. 1, FIGS. 3A and 3B are cross-sectional views taken along lines B-B and C-C in FIG. 2, FIG. 4 is a conceptual view illustrating a flip-chip type semiconductor light emitting device in FIG. 3A, and FIGS. 5A through 5C are conceptual views illustrating various forms for implementing colors in connection with a flip-chip type semiconductor light emitting device.

Figure 2:
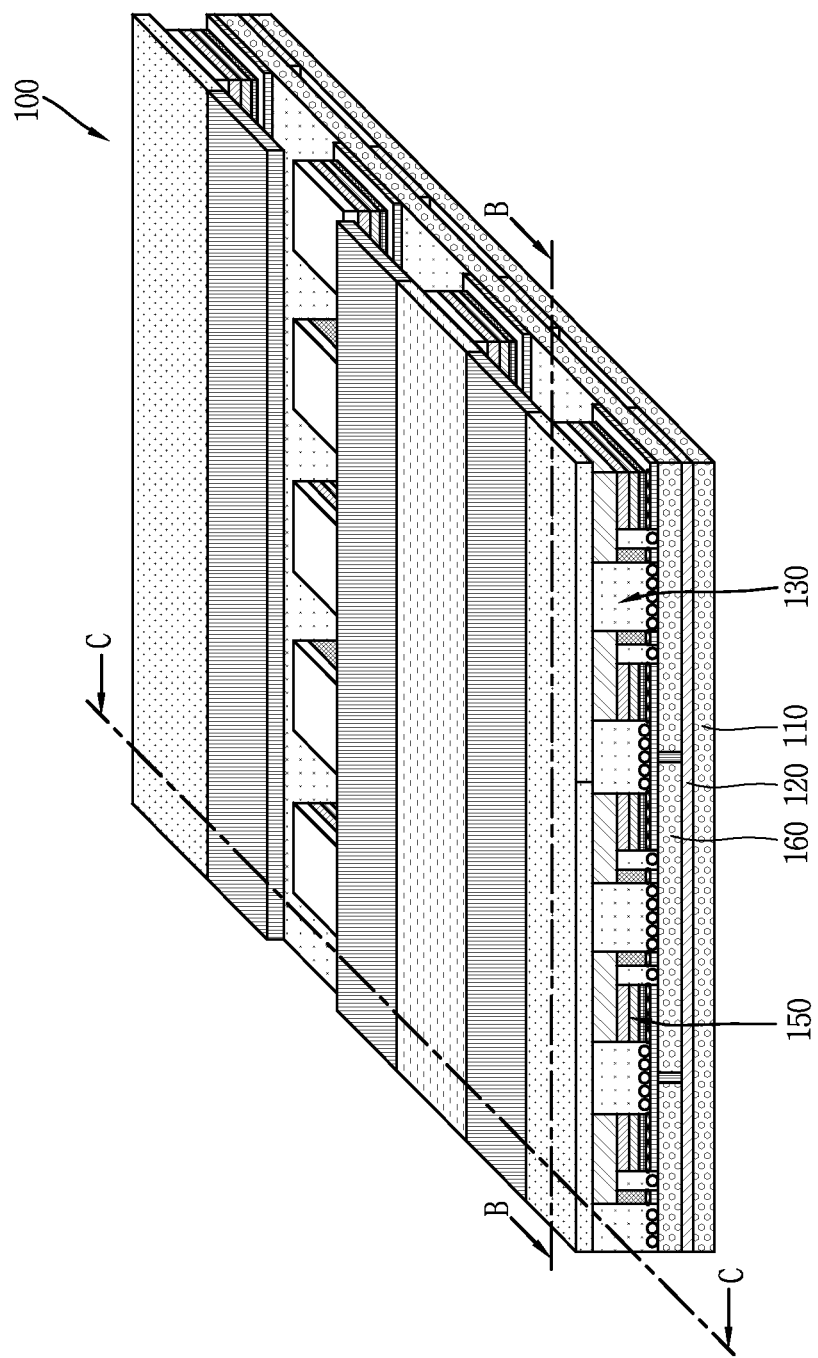
FIG. 2 is an enlarged view of part 'A' in FIG. 1.
Figure 3A:
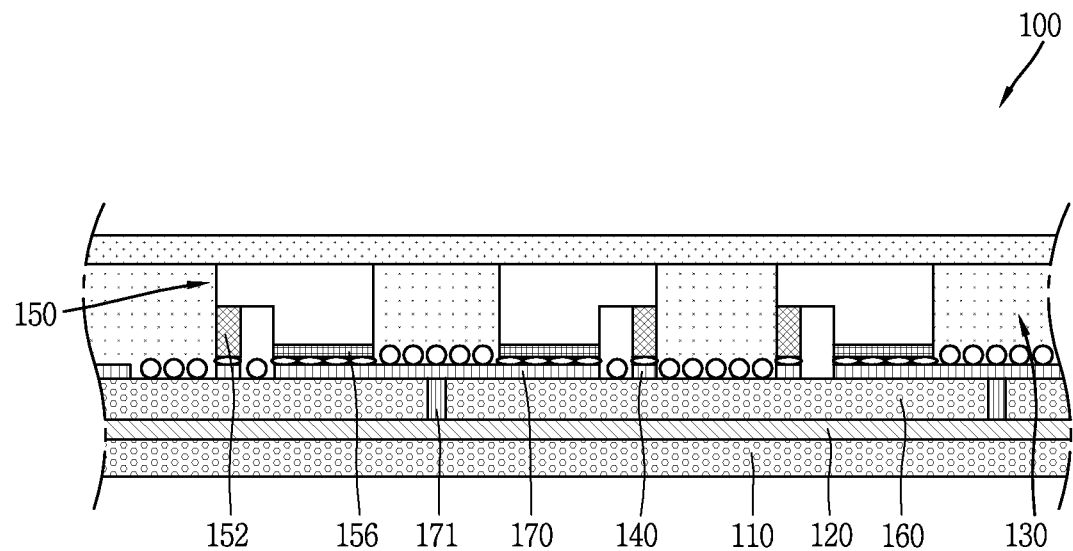
FIGS. 3A and 3B are sectional views taken along lines 'B-B' and 'C-C' in FIG. 2.
Figure 3B:
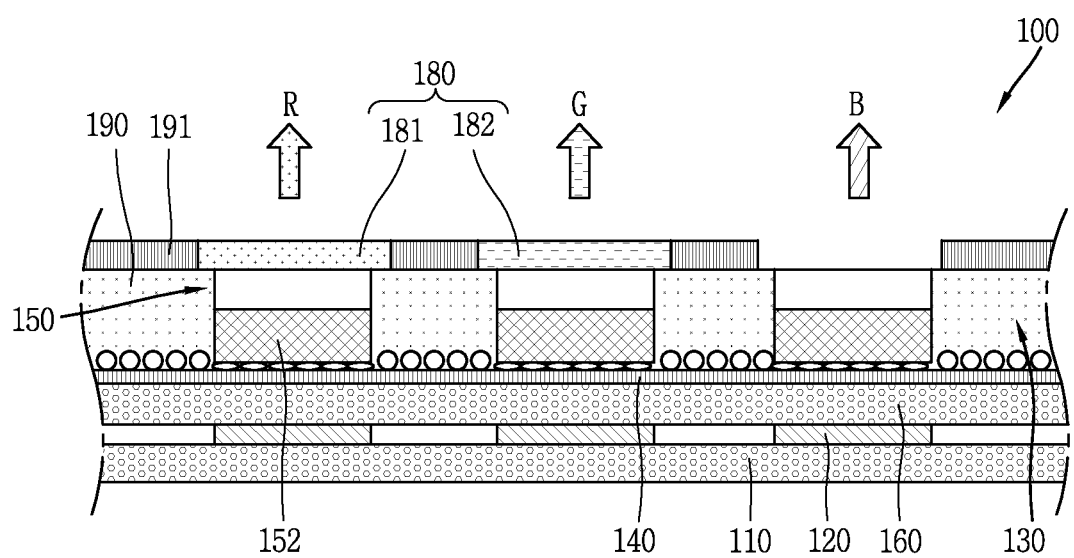
Figure 4:
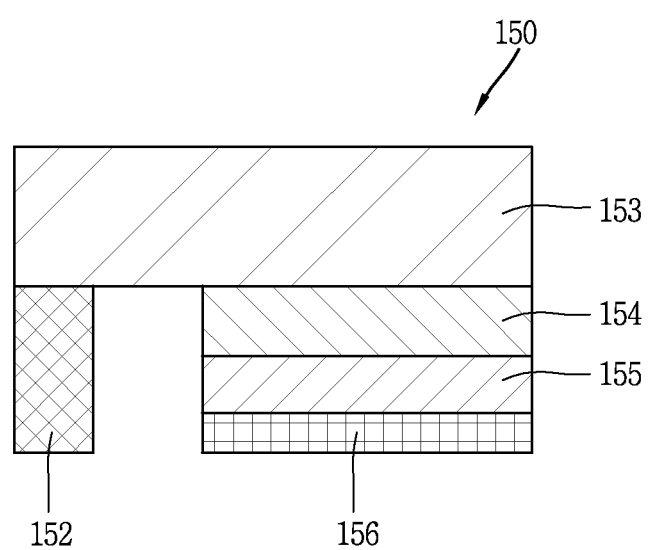
FIG. 4 is a conceptual view illustrating a flip-chip type semiconductor light emitting device of FIG. 3.

FIGS. 2, 3A and 3B illustrate a display device 100 using a passive matrix (PM) type semiconductor light emitting device. However, the following illustration is also applicable to an active matrix (AM) type semiconductor light emitting device.

As shown, the display device 100 may include a substrate 110, a first electrode 120, a conductive adhesive layer 130, a second electrode 140, and a plurality of semiconductor light emitting devices 150. The substrate 110 may be a flexible substrate and contain glass or polyimide (PI) to implement the flexible display device. In addition, a flexible material such as polyethylene naphthalate (PEN), polyethylene terephthalate (PET) or the like may be used. Furthermore, the substrate 110 may be either one of transparent and non-transparent materials.

The substrate 110 may be a wiring substrate disposed with the first electrode 120, and thus the first electrode 120 may be placed on the substrate 110. As shown, an insulating layer 160 may be disposed on the substrate 110 including the first electrode 120, and an auxiliary electrode 170 may be placed on the insulating layer 160. In this instance, a configuration in which the insulating layer 160 is deposited on the substrate 110 may be a single wiring substrate. More specifically, the insulating layer 160 may be incorporated into the substrate 110 with an insulating and flexible material such as polyimide (PI), PET, PEN or the like to form a single wiring substrate.

The auxiliary electrode 170 for electrically-connecting the first electrode 120 to the semiconductor light emitting device 150 is placed on the insulating layer 160, and disposed to correspond to the location of the first electrode 120. For example, the auxiliary electrode 170 has a dot shape, and may be electrically-connected to the first electrode 120 by an electrode hole 171 passing through the insulating layer 160. The electrode hole 171 may be formed by filling a conductive material in a via hole.

Referring to the drawings, the conductive adhesive layer 130 may be formed on one surface of the insulating layer 160, but the present disclosure is not limited to this. For example, it is possible to also have a structure in which the conductive adhesive layer 130 is disposed on the substrate 110 with no insulating layer 160. Further, the conductive adhesive layer 130 can perform the role of an insulating layer in the structure in which the conductive adhesive layer 130 is disposed on the substrate 110.

In addition, the conductive adhesive layer 130 has adhesiveness and conductivity, and thus, a conductive material and an adhesive material may be mixed on the conductive adhesive layer 130. Furthermore, the conductive adhesive layer 130 can have flexibility, thereby allowing a flexible function in the display device.

For example, the conductive adhesive layer 130 may be an anisotropic conductive film (ACF), an anisotropic conductive paste, a solution containing conductive particles, and the like. The conductive adhesive layer 130 allows electrical interconnection in the z-direction passing through the thickness thereof, but can be configured as a layer having electrical insulation in the horizontal x-y direction thereof. Accordingly, the conductive adhesive layer 130 may be referred to as a z-axis conductive layer (hereinafter referred to as a "conductive adhesive layer").

The anisotropic conductive film has a form in which an anisotropic conductive medium is mixed with an insulating base member, and thus when heat and pressure are applied thereto, only a specific portion thereof has conductivity by the anisotropic conductive medium. Hereinafter, heat and pressure are applied to the anisotropic conductive film, but other methods are also available for the anisotropic conductive film to partially have conductivity. The methods include applying only either one of heat and pressure thereto, UV curing, and the like.

Furthermore, the anisotropic conductive medium may be conductive balls or particles. According to the drawing, in the present embodiment, the anisotropic conductive film has a form in which an anisotropic conductive medium is mixed with an insulating base member, and thus when heat and pressure are applied thereto, only a specific portion thereof has conductivity by the conductive balls. The anisotropic conductive film may also be a core with a conductive material containing a plurality of particles coated by an insulating layer with a polymer material, and in this instance, it may have conductivity by the core while having an insulating layer on a portion to which heat and pressure are applied. Here, a core may be transformed to implement a layer having both surfaces to which objects contact in the thickness direction of the film.

For a more specific example, heat and pressure are applied to an anisotropic conductive film as a whole, and an electrical connection in the z-axis direction is partially formed by a height difference from a mating object adhered by the use of the anisotropic conductive film. In another example, an anisotropic conductive film may include a plurality of particles in which a conductive material is coated on insulating cores. In this instance, a portion to which heat and pressure are applied can be converted (pressed and adhered) to a conductive material to have conductivity in the thickness direction of the film. In still another example, the film can be formed to have conductivity in the thickness direction in which a conductive material passes through an insulating base member in the z-direction. In this instance, the conductive material may have a pointed end portion.

According to the drawing, the anisotropic conductive film may be a fixed array anisotropic conductive film (ACF) in which conductive balls are inserted into one surface of the insulating base member. More specifically, the insulating base member includes an adhesive material, and the conductive balls are intensively disposed at a bottom portion of the insulating base member, and when heat and pressure are applied thereto, the base member is modified along with the conductive balls, thereby having conductivity in the vertical direction thereof.

However, the present disclosure is not limited to this, and the anisotropic conductive film can include conductive balls randomly mixed with an insulating base member or a plurality of layers in which conductive balls are disposed at any one layer (double-ACF), and the like. The anisotropic conductive paste may include conductive balls mixed with an insulating and adhesive base material. Furthermore, a solution containing conductive particles may include conductive particles or nano particles.

Referring to FIGS. 3A and 3B again, the second electrode 140 is located at the insulating layer 160 and separated from the auxiliary electrode 170. In other words, the conductive adhesive layer 130 is disposed on the insulating layer 160 located with the auxiliary electrode 170 and second electrode 140. When the conductive adhesive layer 130 is formed in a state that the auxiliary electrode 170 and second electrode 140 are located, and then the semiconductor light emitting device 150 is connect thereto in a flip chip form with the application of heat and pressure, the semiconductor light emitting device 150 is electrically-connected to the first electrode 120 and second electrode 140.

Referring to FIG. 4, the semiconductor light emitting device 150 may be a flip chip type semiconductor light emitting device. For example, the semiconductor light emitting device 150 may include a p-type electrode 156, a p-type semiconductor layer 155 formed with the p-type electrode 156, an active layer 154 formed on the p-type semiconductor layer 155, an n-type semiconductor layer 153 formed on the active layer 154, and an n-type electrode 152 disposed to be separated from the p-type electrode 156 in the horizontal direction on the n-type semiconductor layer 153. In this instance, the p-type electrode 156 may be electrically-connected to the welding portion by the conductive adhesive layer 130, and the n-type electrode 152 may be electrically-connected to the second electrode 140.

Referring to FIGS. 2, 3A and 3B again, the auxiliary electrode 170 may be formed in an elongated manner in one direction to be electrically-connected to a plurality of semiconductor light emitting devices 150. For example, the left and right p-type electrodes of the semiconductor light emitting devices around the auxiliary electrode may be electrically-connected to one auxiliary electrode. More specifically, the semiconductor light emitting device 150 is pressed into the conductive adhesive layer 130, and through this, only a portion between the p-type electrode 156 and auxiliary electrode 170 of the semiconductor light emitting device 150 and a portion between the n-type electrode 152 and second electrode 140 of the semiconductor light emitting device 150 have conductivity, and the remaining portion does not have conductivity.

Furthermore, a plurality of semiconductor light emitting devices 150 constitute a light-emitting array, and a phosphor layer 180 is formed on the light-emitting array. The light emitting device may include a plurality of semiconductor light emitting devices with different self luminance values. Each of the semiconductor light emitting devices 150 constitutes a sub-pixel, and is electrically-connected to the first electrode 120. For example, a plurality of first electrodes 120 can exist, and the semiconductor light emitting devices 150 are arranged in several rows, for instance, and each row of the semiconductor light emitting devices 150 can be electrically-connected to any one of the plurality of first electrodes.

Furthermore, the semiconductor light emitting devices 150 may be connected in a flip chip form, and thus semiconductor light emitting devices grown on a transparent dielectric substrate. In addition, the semiconductor light emitting devices 150 may be nitride semiconductor light emitting devices, for instance. The semiconductor light emitting device 150 has an excellent luminance characteristic, and thus it is possible to configure individual sub-pixels even with a small size thereof.

According to FIG. 3B, a partition wall 190 may be formed between the semiconductor light emitting devices 150. In this instance, the partition wall 190 divides individual sub-pixels from one another, and may be formed as an integral body with the conductive adhesive layer 130. For example, a base member of the anisotropic conductive film may form the partition wall when the semiconductor light emitting device 150 is inserted into the anisotropic conductive film.

Furthermore, when the base member of the anisotropic conductive film is black, the partition wall 190 may have reflective characteristics while at the same time increasing contrast with no additional black insulator. In another example, a reflective partition wall may be separately provided with the partition wall 190. In this instance, the partition wall 190 may include a black or white insulator according to the purpose of the display device. Further, the partition wall 190 may have an effect of enhancing reflectivity when the partition wall of the while insulator is used, and increase contrast while at the same time having reflective characteristics.

In addition, the phosphor layer 180 may be located at an outer surface of the semiconductor light emitting device 150. For example, the semiconductor light emitting device 150 can be a blue semiconductor light emitting device that emits blue (B) light, and thus the phosphor layer 180 performs the role of converting the blue (B) light into the color of a sub-pixel. The phosphor layer 180 may also be a red phosphor layer 181 or green phosphor layer 182 constituting individual pixels.

In other words, a red phosphor 181 capable of converting blue light into red (R) light may be deposited on the blue semiconductor light emitting device 150 at a location implementing a red sub-pixel, and a green phosphor 182 capable of converting blue light into green (G) light may be deposited on the blue semiconductor light emitting device 150 at a location implementing a green sub-pixel. Furthermore, the blue semiconductor light emitting device 150 may be solely used at a location implementing a blue sub-pixel. In this instance, the red (R), green (G) and blue (B) sub-pixels may implement one pixel. More specifically, one color phosphor may be deposited along each line of the first electrode 120. Accordingly, one line on the first electrode 120 may be an electrode controlling one color. In other words, red (R), green (B) and blue (B) may be sequentially disposed, thereby implementing sub-pixels.

However, the present disclosure is not limited to this, and the semiconductor light emitting device 150 may be combined with a quantum dot (QD) instead of a phosphor to implement sub-pixels such as red (R), green (G) and blue (B). Furthermore, a black matrix 191 may be disposed between each phosphor layer to enhance contrast. In other words, the black matrix 191 can enhance the contrast of luminance. However, the present disclosure is not limited to this, and another structure for implementing blue, red and green may be also applicable thereto.

Figure 5A:
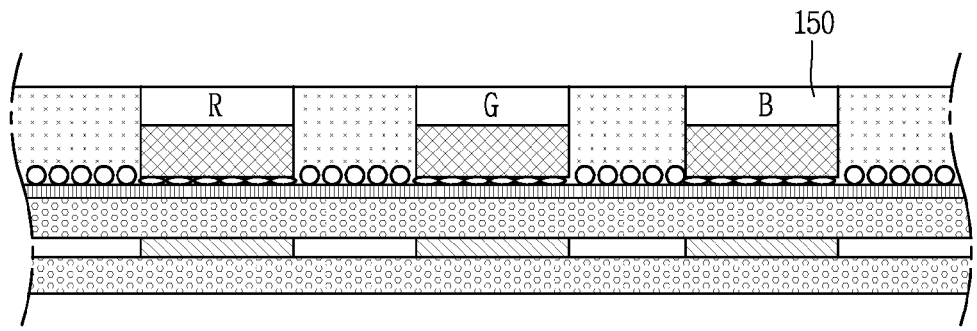
FIGS. 5A to 5C are conceptual views illustrating a plurality of forms to implement colors in connection with a flip-chip type semiconductor light emitting device.

Referring to FIG. 5A, each of the semiconductor light emitting devices 150 may be implemented with a high-power light emitting device that emits various light including blue in which gallium nitride (GaN) is mostly used, and indium (In) and or aluminum (Al) are added thereto. In this instance, the semiconductor light emitting device 150 may be red, green and blue semiconductor light emitting devices, respectively, to implement each sub-pixel. For instance, red, green and blue semiconductor light emitting devices (R, G, B) are alternately disposed, and red, green and blue sub-pixels implement one pixel by means of the red, green and blue semiconductor light emitting devices, thereby implementing a full color display.

Figure 5B:
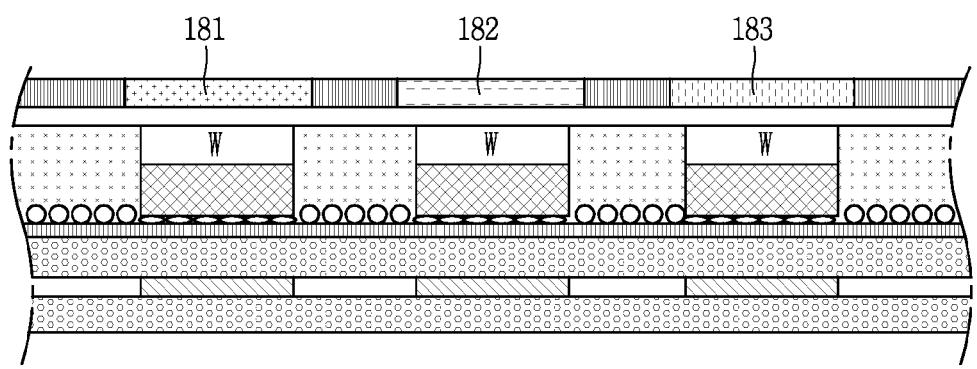

Referring to FIG. 5B, the semiconductor light emitting device may have a white light emitting device (W) provided with a yellow phosphor layer for each element. In this instance, a red phosphor layer 181, a green phosphor layer 182 and blue phosphor layer 183 may be provided on the white light emitting device (W) to implement a sub-pixel. Furthermore, a color filter repeated with red, green and blue on the white light emitting device (W) may be used to implement a sub-pixel.

Figure 5C:
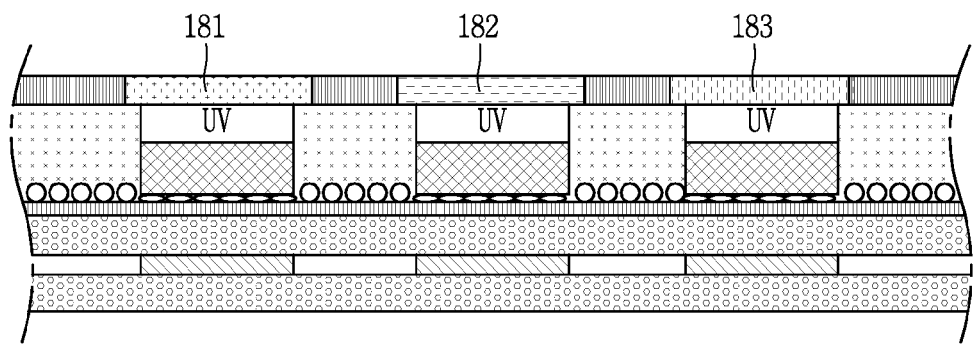

Referring to FIG. 5C, it is possible to also have a structure in which a red phosphor layer 181, a green phosphor layer 182 and blue phosphor layer 183 may be provided on a ultra violet light emitting device (UV). Thus, the semiconductor light emitting device can be used over the entire region up to ultra violet (UV) as well as visible light, and may be extended to a form of semiconductor light emitting device in which ultra violet (UV) can be used as an excitation source.

Taking the present example into consideration again, the semiconductor light emitting device 150 is placed on the conductive adhesive layer 130 to configure a sub-pixel in the display device. The semiconductor light emitting device 150 has excellent luminance characteristics, and thus it is possible to configure individual sub-pixels even with a small size thereof. The size of the individual semiconductor light emitting device 150 may be less than 80 μm in the length of one side thereof, and formed with a rectangular or square shaped element. For a rectangular shaped element, the size thereof may be less than 20×80 μm.

Furthermore, even when a square shaped semiconductor light emitting device 150 with a length of side of 10 μm is used for a sub-pixel, it will exhibit a sufficient brightness for implementing a display device. Accordingly, for example, for a rectangular pixel in which one side of a sub-pixel is 600 μm in size, and the remaining one side thereof is 300 μm, a relative distance between the semiconductor light emitting devices becomes sufficiently large. Accordingly, in this instance, it is possible to implement a flexible display device having a HD image quality.

A display device using the foregoing semiconductor light emitting device will be fabricated by a new type of fabrication method. Hereinafter, the fabrication method will be described with reference to FIG. 6. In particular, FIG. 6 includes cross-sectional views illustrating a method of fabricating a display device using a semiconductor light emitting device according to an embodiment of the present disclosure.

Figure 6:
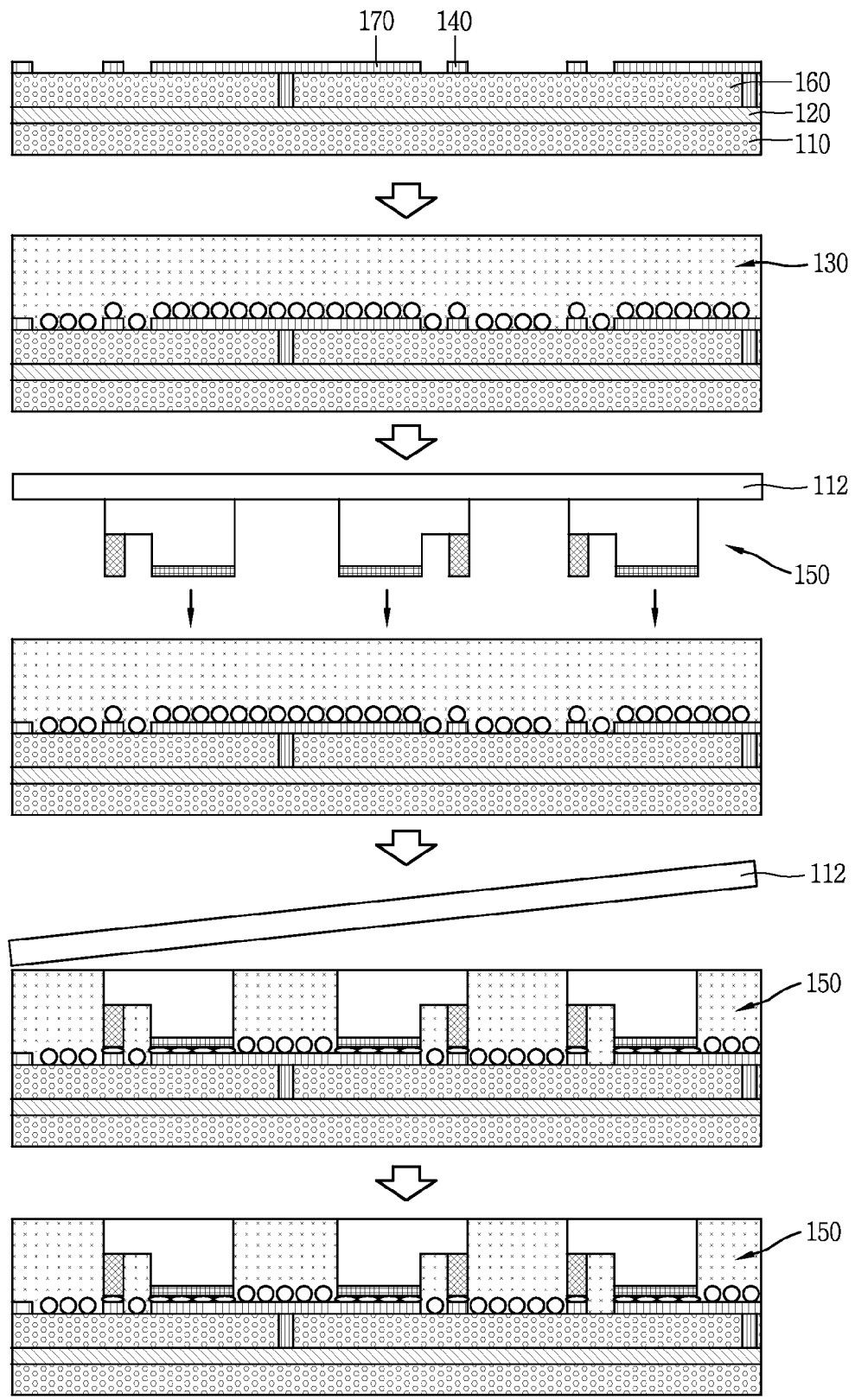
FIG. 6 shows sectional views illustrating a method for manufacturing a display device using a semiconductor light emitting device according to an embodiment of the present invention.

Referring to FIG. 6, first, the conductive adhesive layer 130 is formed on the insulating layer 160 located with the auxiliary electrode 170 and second electrode 140. In addition, the insulating layer 160 is deposited on the first substrate 110 to form one substrate (or wiring substrate), and the first electrode 120, auxiliary electrode 170 and second electrode 140 are disposed at the wiring substrate. In this instance, the first electrode 120 and second electrode 140 may be disposed in a perpendicular direction to each other. Furthermore, the first substrate 110 and insulating layer 160 may contain glass or polyimide (PI), respectively, to implement a flexible display device. As discussed above, the conductive adhesive layer 130 may be an anisotropic conductive film, for example, and thus, an anisotropic conductive film may be coated on a substrate located with the insulating layer 160.

Next, a second substrate 112 located with a plurality of semiconductor light emitting devices 150 corresponding to the location of the auxiliary electrodes 170 and second electrodes 140 and constituting individual pixels is disposed such that the semiconductor light emitting device 150 faces the auxiliary electrode 170 and second electrode 140. In this instance, the second substrate 112 as a growth substrate for growing the semiconductor light emitting device 150 may be a sapphire substrate or silicon substrate. Further, the semiconductor light emitting device may have a gap and size capable of implementing a display device when formed in the unit of wafer, and thus effectively used for a display device.

Next, the wiring substrate is thermally compressed to the second substrate 112. For example, the wiring substrate and second substrate 112 may be thermally compressed to each other by applying an ACF press head. The wiring substrate and second substrate 112 are bonded to each other using the thermal compression. In addition, only a portion between the semiconductor light emitting device 150 and the auxiliary electrode 170 and second electrode 140 have conductivity due to the characteristics of an anisotropic conductive film having conductivity by thermal compression, thereby allowing the electrodes and semiconductor light emitting device 150 to be electrically-connected to each other. At this time, the semiconductor light emitting device 150 may be inserted into the anisotropic conductive film, thereby forming a partition wall between the semiconductor light emitting devices 150.

Next, the second substrate 112 is removed. For example, the second substrate 112 may be removed using a laser lift-off (LLO) or chemical lift-off (CLO) method. Finally, the second substrate 112 is removed to expose the semiconductor light emitting devices 150 to the outside. Silicon oxide (SiOx) or the like may be coated on the wiring substrate coupled to the semiconductor light emitting device 150 to form a transparent insulating layer.

The method may further include the process of forming a phosphor layer on one surface of the semiconductor light emitting device 150. For example, the semiconductor light emitting device 150 may be a blue semiconductor light emitting device for emitting blue (B) light, and red or green phosphor for converting the blue (B) light into the color of the sub-pixel may form a layer on one surface of the blue semiconductor light emitting device.

In addition, the fabrication method or structure of a display device using the foregoing semiconductor light emitting device may be modified in various forms. For example, the foregoing display device may be applicable to a vertical semiconductor light emitting device. Hereinafter, the vertical structure will be described with reference to FIGS. 5 and 6. Furthermore, according to the following modified example or embodiment, the same or similar reference numerals are designated to the same or similar configurations to the foregoing example, and the description thereof will be substituted by the earlier description.

Figure 7:
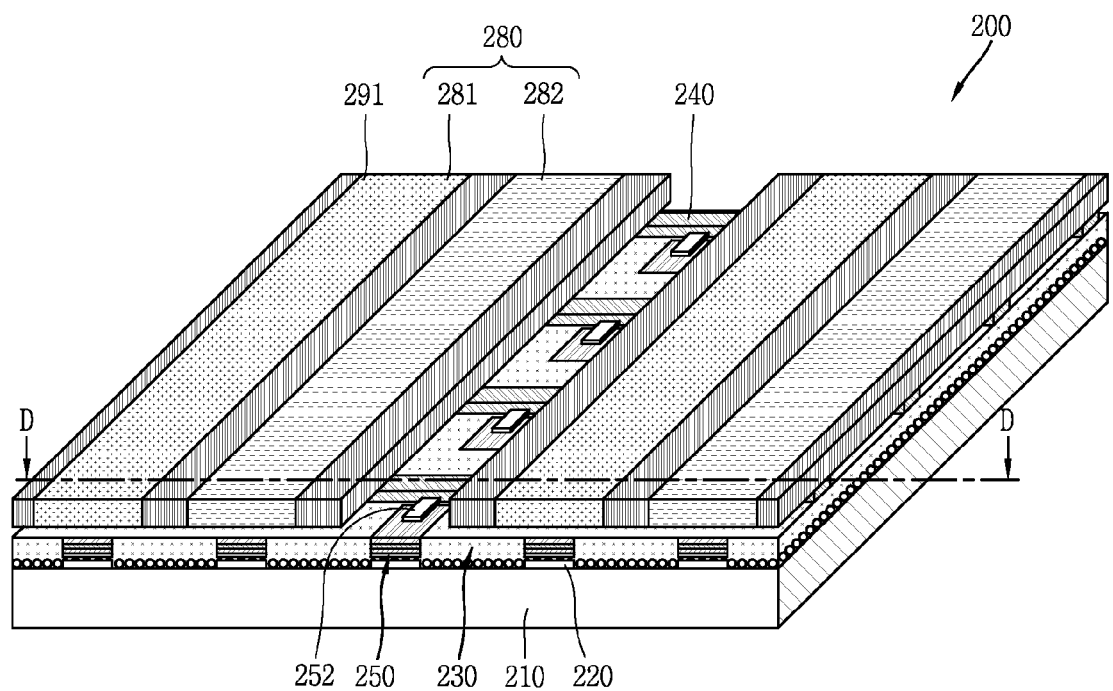
FIG. 7 is a perspective view illustrating another embodiment of a display device using a semiconductor light emitting device according to an embodiment of the present invention.
Figure 8:
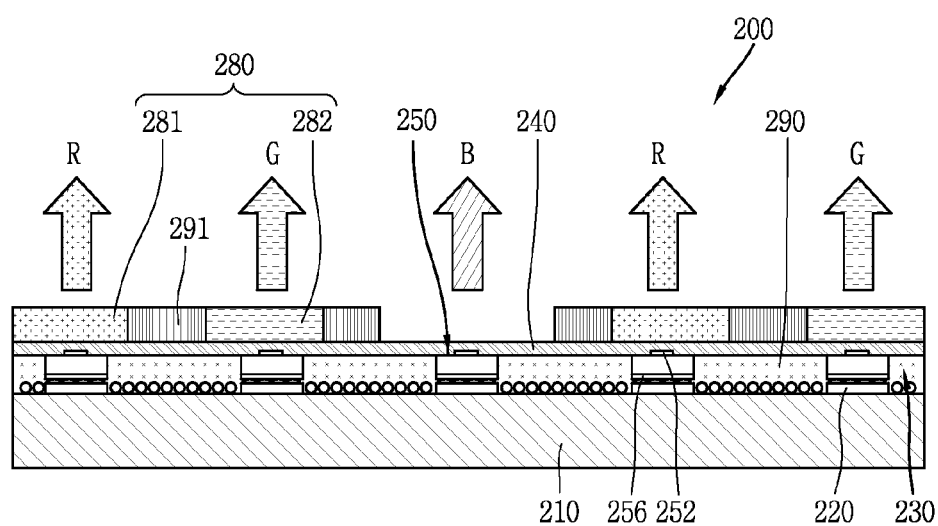
FIG. 8 is a sectional view taken along line 'D-D' in FIG. 7.
Figure 9:
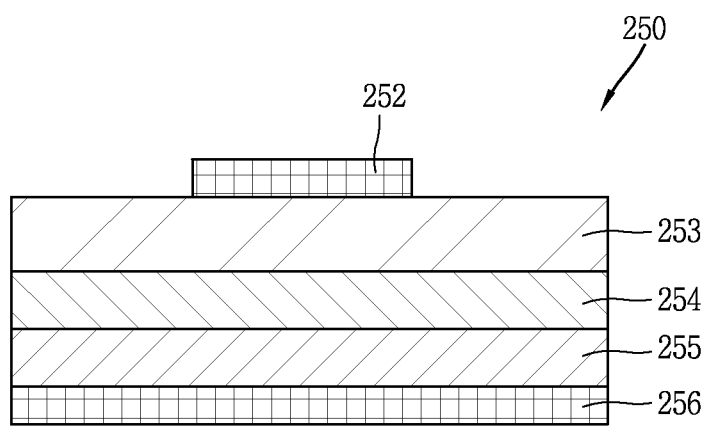
FIG. 9 is a conceptual view illustrating a vertical-type semiconductor light emitting device of FIG. 8.

FIG. 7 is a perspective view illustrating a display device 200 using a semiconductor light emitting device according to another embodiment of the present disclosure, FIG. 8 is a cross-sectional view taken along line D-D in FIG. 7, and FIG. 9 is a conceptual view illustrating a vertical type semiconductor light emitting device in FIG. 8.

As shown, the display device 200 can use a passive matrix (PM) type of vertical semiconductor light emitting device. The display device 200 may include a substrate 210, a first electrode 220, a conductive adhesive layer 230, a second electrode 240 and a plurality of semiconductor light emitting devices 250. Further, the substrate 210 as a wiring substrate disposed with the first electrode 220 may include polyimide (PI) to implement a flexible display device. In addition, any one may be used if it is an insulating and flexible material.

The first electrode 220 may be located on the substrate 210, and formed with an electrode having a bar elongated in one direction. In addition, the first electrode 220 may perform the role of a data electrode. The conductive adhesive layer 230 is formed on the substrate 210 located with the first electrode 220. Similarly to a display device to which a flip chip type light emitting device is applied, the conductive adhesive layer 230 may be an anisotropic conductive film (ACF), an anisotropic conductive paste, a solution containing conductive particles, and the like. However, the present embodiment illustrates the conductive adhesive layer 230 being implemented by an anisotropic conductive film.

When an anisotropic conductive film is located when the first electrode 220 is located on the substrate 210, and then heat and pressure are applied to connect the semiconductor light emitting device 250 thereto, the semiconductor light emitting device 250 is electrically-connected to the first electrode 220. At this time, the semiconductor light emitting device 250 is preferably disposed on the first electrode 220. The electrical connection is generated because an anisotropic conductive film partially has conductivity in the thickness direction when heat and pressure are applied as described above. Accordingly, the anisotropic conductive film is partitioned into a portion having conductivity and a portion having no conductivity in the thickness direction thereof.

Furthermore, the anisotropic conductive film contains an adhesive component, and thus the conductive adhesive layer 230 implements a mechanical coupling as well as an electrical coupling between the semiconductor light emitting device 250 and the first electrode 220. Thus, the semiconductor light emitting device 250 is placed on the conductive adhesive layer 230, thereby configuring a separate sub-pixel in the display device. The semiconductor light emitting device 250 has excellent luminance characteristics, and thus it is possible to configure individual sub-pixels even with a small size thereof. The size of the individual semiconductor light emitting device 250 may be less than 80 μm in the length of one side thereof, and formed with a rectangular or square shaped element. For a rectangular shaped element, the size thereof may be less than 20×80 μm.

The semiconductor light emitting device 250 may be a vertical structure. Further, a plurality of second electrodes 240 disposed in a direction crossed with the length direction of the first electrode 220, and electrically-connected to the vertical semiconductor light emitting device 250 may be located between vertical semiconductor light emitting devices.

Referring to FIG. 9, the vertical semiconductor light emitting device 250 may include a p-type electrode 256, a p-type semiconductor layer 255 formed with the p-type electrode 256, an active layer 254 formed on the p-type semiconductor layer 255, an n-type semiconductor layer 253 formed on the active layer 254, and an n-type electrode 252 formed on the n-type semiconductor layer 253. In this instance, the p-type electrode 256 located at the bottom thereof may be electrically-connected to the first electrode 220 by the conductive adhesive layer 230, and the n-type electrode 252 located at the top thereof may be electrically-connected to the second electrode 240 which will be described later. The electrodes may be disposed in the upward/downward direction in the vertical semiconductor light emitting device 250, thereby advantageously reducing the chip size.

Referring to FIG. 8, a phosphor layer 280 may be formed on one surface of the semiconductor light emitting device 250. For example, the semiconductor light emitting device 250 can be a blue semiconductor light emitting device that emits blue (B) light, and the phosphor layer 280 for converting the blue (B) light into the color of the sub-pixel may be provided thereon. In this instance, the phosphor layer 280 may be a red phosphor 281 and a green phosphor 282 constituting individual pixels.

In other words, a red phosphor 281 capable of converting blue light into red (R) light may be deposited on the blue semiconductor light emitting device 250 at a location implementing a red sub-pixel, and a green phosphor 282 capable of converting blue light into green (G) light may be deposited on the blue semiconductor light emitting device 250 at a location implementing a green sub-pixel. Furthermore, the blue semiconductor light emitting device 250 may be solely used at a location implementing a blue sub-pixel. In this instance, the red (R), green (G) and blue (B) sub-pixels may implement one pixel.

However, the present disclosure is not limited to this, and another structure for implementing blue, red and green may be also applicable thereto as described above in a display device to which a flip chip type light emitting device is applied. Taking the present embodiment into consideration again, the second electrode 240 is located between the semiconductor light emitting devices 250, and electrically-connected to the semiconductor light emitting devices 250. For example, the semiconductor light emitting devices 250 may be disposed in a plurality of rows, and the second electrode 240 may be located between the rows of the semiconductor light emitting devices 250.

Since a distance between the semiconductor light emitting devices 250 constituting individual pixels is sufficiently large, the second electrode 240 may be located between the semiconductor light emitting devices 250. Further, the second electrode 240 may be formed with an electrode having a bar elongated in one direction, and disposed in a perpendicular direction to the first electrode.

Furthermore, the second electrode 240 may be electrically-connected to the semiconductor light emitting device 250 by a connecting electrode protruded from the second electrode 240. More specifically, the connecting electrode may be an n-type electrode of the semiconductor light emitting device 250. For example, the n-type electrode is formed with an ohmic electrode for ohmic contact, and the second electrode covers at least part of the ohmic electrode by printing or deposition. Through this, the second electrode 240 may be electrically-connected to the n-type electrode of the semiconductor light emitting device 250.

According to FIG. 8, the second electrode 240 can be located on the conductive adhesive layer 230. In addition, a transparent insulating layer containing silicon oxide (SiOx) may be formed on the substrate 210 including the semiconductor light emitting device 250. When the transparent insulating layer is formed and then the second electrode 240 is placed thereon, the second electrode 240 can be located on the transparent insulating layer. Furthermore, the second electrode 240 may be formed to be separated from the conductive adhesive layer 230 or transparent insulating layer.

If a transparent electrode such as indium tin oxide (ITO) is used to attach the second electrode 240 on the semiconductor light emitting device 250, the ITO material has a problem of poor adhesiveness with an n-type semiconductor. Accordingly, the second electrode 240 can be placed between the semiconductor light emitting devices 250, thereby obtaining an advantage in which the transparent electrode is not required. Accordingly, an n-type semiconductor layer and a conductive material having a good adhesiveness may be used as a horizontal electrode without being restricted by the selection of a transparent material, thereby enhancing the light extraction efficiency.

According to FIG. 8, a partition wall 290 may be formed between the semiconductor light emitting devices 250. In other words, the partition wall 290 can be disposed between the vertical semiconductor light emitting devices 250 to isolate the semiconductor light emitting device 250 constituting individual pixels. In this instance, the partition wall 290 divides individual sub-pixels from one another, and may be formed as an integral body with the conductive adhesive layer 230. For example, a base member of the anisotropic conductive film may form the partition wall when the semiconductor light emitting device 250 is inserted into the anisotropic conductive film.

Furthermore, when the base member of the anisotropic conductive film is black, the partition wall 290 may have reflective characteristics while at the same time increasing contrast with no additional black insulator. In another example, a reflective partition wall may be separately provided with the partition wall 290. In this instance, the partition wall 290 may include a black or white insulator according to the purpose of the display device.

If the second electrode 240 is precisely located on the conductive adhesive layer 230 between the semiconductor light emitting devices 250, the partition wall 290 may be located between the semiconductor light emitting device 250 and second electrode 240. Accordingly, individual sub-pixels may be configured even with a small size using the semiconductor light emitting device 250, and a distance between the semiconductor light emitting devices 250 may be relatively sufficiently large to place the second electrode 240 between the semiconductor light emitting devices 250, thereby having the effect of implementing a flexible display device having an HD image quality.

Furthermore, a black matrix 291 may be disposed between each phosphor layer to enhance contrast. In other words, the black matrix 291 can enhance the contrast of luminance. As described above, the semiconductor light emitting device 250 is located on the conductive adhesive layer 230, thereby constituting individual pixels on the display device. The semiconductor light emitting device 250 also has excellent luminance characteristics, thereby configuring individual sub-pixels even with a small size thereof. As a result, it is possible to implement a full color display in which the sub-pixels of red (R), green (G) and blue (B) implement one pixel by the semiconductor light emitting device.

In the aforementioned display device, wiring lines crossing each other are disposed on a wiring substrate so that driving signals can be transmitted to semiconductor light emitting devices. Some of the wiring lines, which are extended to one direction, constitute scan electrodes. Others of the wiring lines, which are extended to another direction perpendicular to the one direction, constitute data electrodes. In order to provide a scan driving signal and a data driving signal to the scan electrode and the data electrode, respectively, a driving part for providing the driving signals is electrically-connected to the wiring lines. Such a wiring structure is implemented by additional wiring processes, and the present invention provides a structure and a method capable of simplifying such wiring processes.

Hereinafter, a structure of a display device according to an embodiment of the present invention will be explained in more detail with reference to the attached drawings. In particular, FIG. 10A is a perspective view of a display device according to an embodiment of the present invention, and FIG. 10B is a conceptual view illustrating a structure where electrodes are arranged on a wiring substrate of a display device according to an embodiment of the present invention.

Figure 10A:
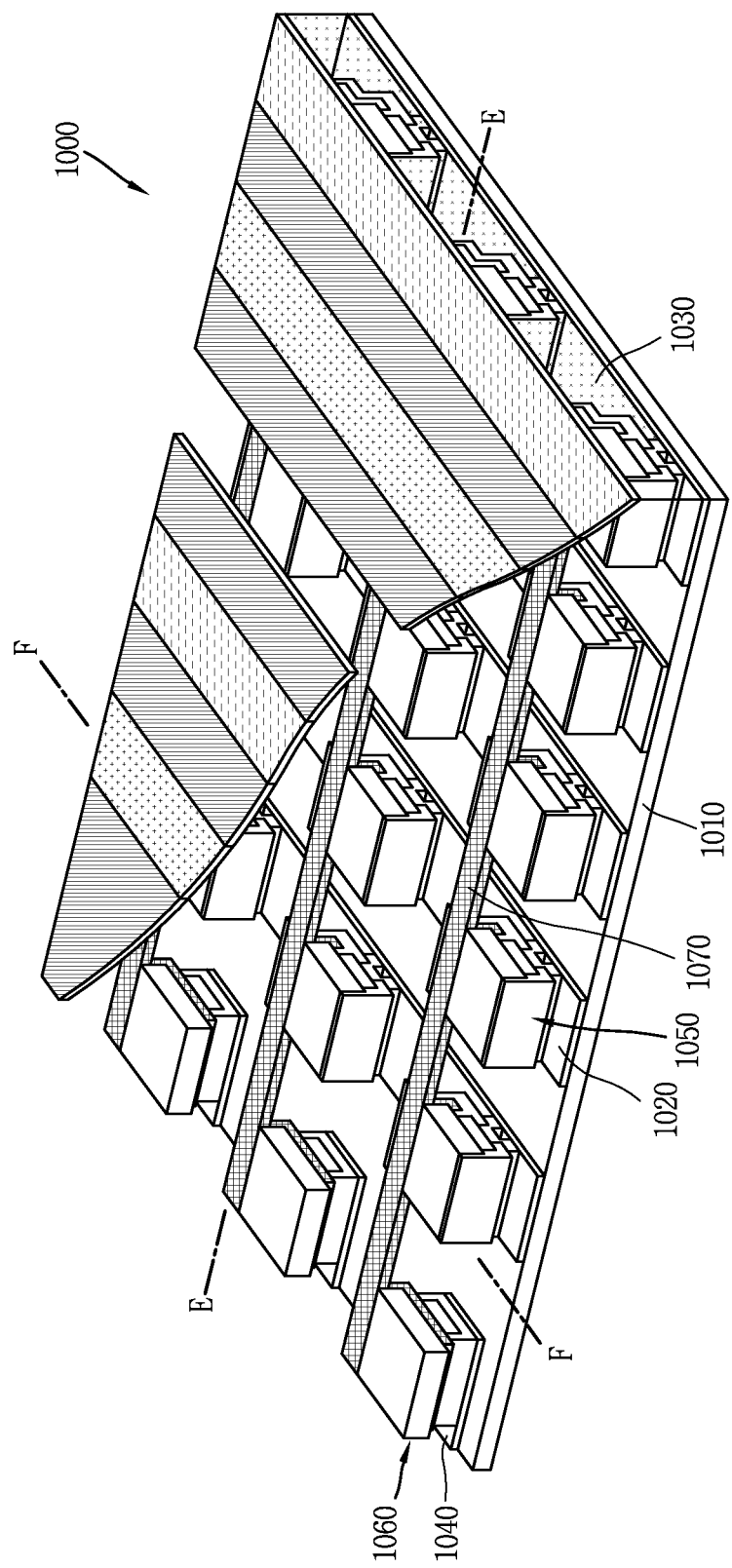
FIG. 10A is a perspective view of a display device according to an embodiment of the present invention.
Figure 10B:
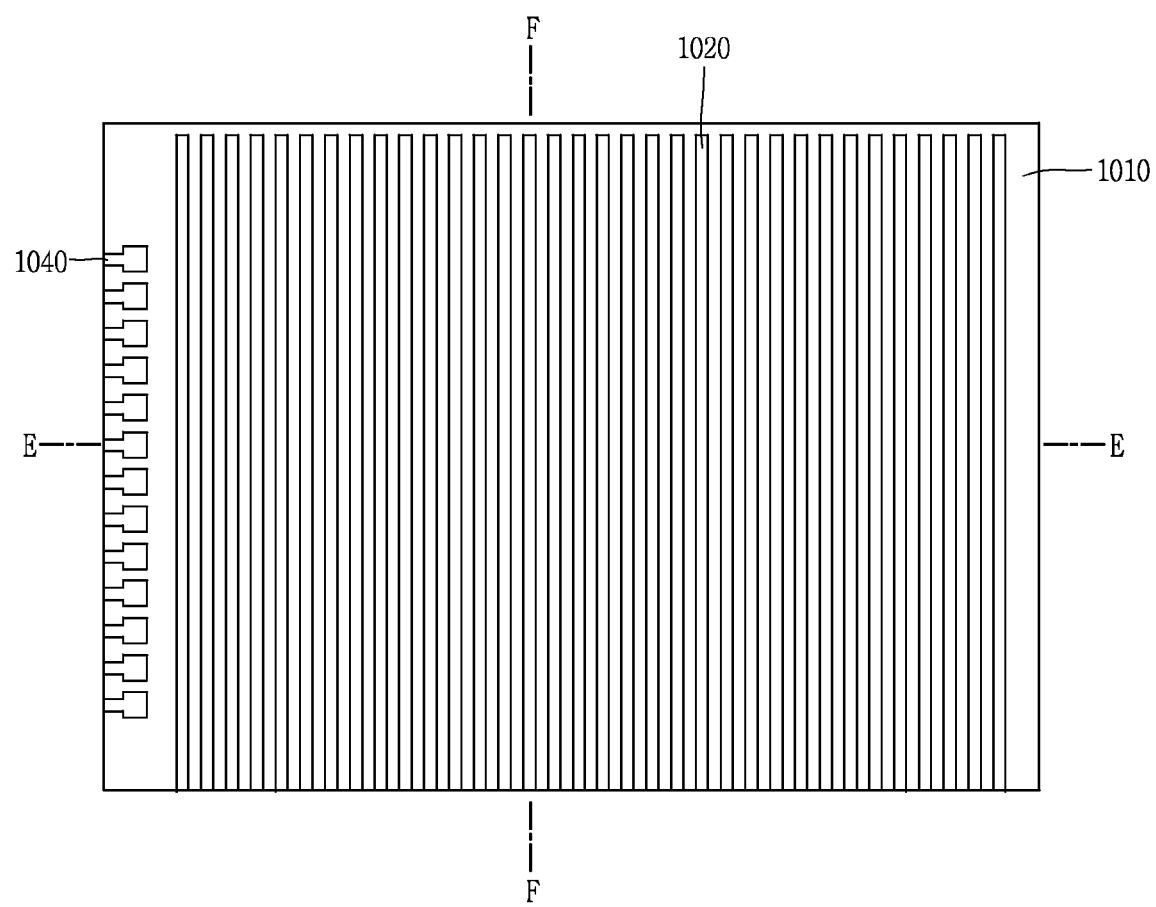
FIG. 10B is a conceptual view illustrating a structure where electrodes are arranged on a wiring substrate of a display device according to an embodiment of the present invention.

Referring to FIGS. 10A and 10B, a passive matrix (PM) type display device 1000 using a semiconductor light emitting device is illustrated. However, the following embodiment is also applicable to an active matrix (AM) type display device using a semiconductor light emitting device.

The display device 1000 according to an embodiment of the present invention includes a substrate (or a wiring substrate) 1010, a first electrode (or a first wiring line) 1020, a conductive adhesive layer 1030, a second electrode (or a second wiring line) 1040, a plurality of semiconductor light emitting devices 1050 and a connection part 1060. In the following descriptions, the first electrode may be referred to as 'the first wiring line', and the second electrode may be referred to as 'the second wiring line'.

The wiring substrate 1010, a substrate where the wiring lines 1020 and 1040 are arranged, may include polyimide (PI) for implementation of a flexible display device. The wiring substrate 1010 may be formed of any material which has an insulating property and a flexible property. More specifically, the first wiring line 1020 and the second wiring line 1040 may be formed on one surface (the same surface) of the wiring substrate 1010, respectively.

As shown, the first wiring line 1020 may be formed as a bar type electrode long in one direction (e.g., 'F-F direction). The first wiring line 1020 may serve as a data electrode. The second wiring line 1040 may be disposed at an edge of the wiring substrate 1010, and may be extended to a direction perpendicular to the first wiring line 1020 (e.g., 'E-E' direction). The second wiring line 1040 may serve as a scan electrode.

In addition, the first wiring line 1020 is electrically-connected to the plurality of semiconductor light emitting devices 1050 through the conductive adhesive layer 1030. The conductive adhesive layer 1030 is formed on the wiring substrate 1010 where the first wiring line 1020 is located. As in the aforementioned display device to which a flip-chip type semiconductor light emitting device has been applied, the conductive adhesive layer 1030 may be configured as an anisotropy conductive film (ACF), an anisotropy conductive paste, a solution containing conductive particles, etc. In this embodiment, the conductive adhesive layer 1030 is configured as an anisotropy conductive film (ACF).

In this instance, as the first wiring line 1020 is electrically-connected to the plurality of semiconductor light emitting devices 1050 through the conductive adhesive layer 1030, formed is a first conducting path along which data driving signals are applied to the plurality of semiconductor light emitting devices 1050. A second conducting path, along which scan driving signals are applied to the plurality of semiconductor light emitting devices 1050 is implemented by the connection part 1060.

For instance, the second wiring line 1040 is electrically-connected to the connection part 1060 through the conductive adhesive layer 1030. The connection part 1060 is configured to electrically-connect the wiring substrate with the plurality of semiconductor light emitting devices, and is disposed to face the second wiring line 1040. When the wiring substrate 1010 is provided with the first wiring line 1020 and the second wiring line 1040, an anisotropy conductive film is positioned on the wiring substrate 1010. Then, the semiconductor light emitting devices 1050 and the connection part 1060 are connected to the wiring substrate 1010 by applying heat and pressure to the anisotropy conductive film.

As a result, the semiconductor light emitting devices 1050 and the connection part 1060 are electrically-connected to the first wiring line 1020 and the second wiring line 1040, respectively. The electrical connection is generated because the anisotropy conductive film has conductivity partially in a thickness direction when heat and pressure is applied thereto. Thus, the anisotropy conductive film is divided into a conductive region and a non-conductive region in a thickness direction. Since the anisotropy conductive film contains an adhesive material, the conductive adhesive layer 1030 implements electrical connection and mechanical coupling between the semiconductor light emitting devices 1050 and the first wiring line 1020, and between the connection part 1060 and the second wiring line 1040.

A connection line 1070, configured to electrically-connect the semiconductor light emitting devices 1050 with the connection part 1060, and configured to electrically-connect the second wiring line 1040 with a driving part, may be provided on the semiconductor light emitting devices 1050. The connection line 1070 can connect the neighboring semiconductor light emitting devices 1050 with each other, in a direction crossing the first wiring line 1020.

More specifically, the first wiring line 1020 electrically-connects the neighboring semiconductor light emitting devices 1050 with each other in an 'F-F' direction. In addition, the connection line 1070 electrically-connects the neighboring semiconductor light emitting devices 1050 with each other in an 'E-E' direction crossing the first wiring line 1020. The connection part 1060 is grown together with the semiconductor light emitting devices 1050.

Figure 11A:
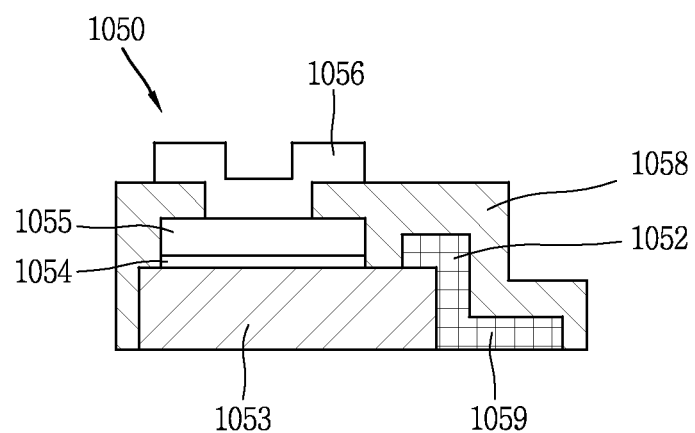
FIGS. 11A and 11B are sectional views illustrating a structure of a semiconductor light emitting device and a connection part according to an embodiment of the present invention.
Figure 11B:
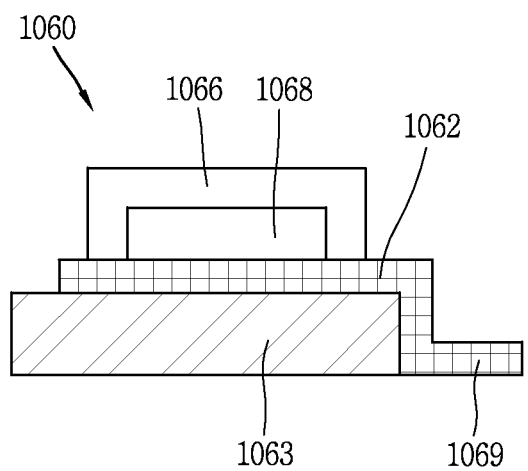
Figure 12A:
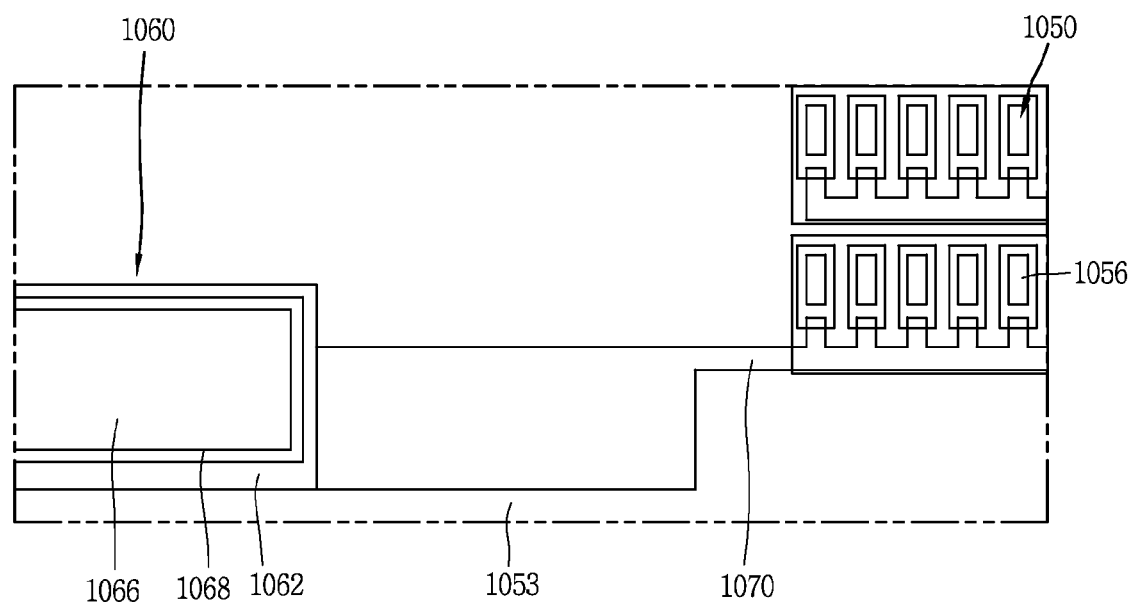
FIGS. 12A and 12B are conceptual views illustrating a structure where a semiconductor light emitting device and a connection part have grown on a substrate according to an embodiment of the present invention.
Figure 12B:
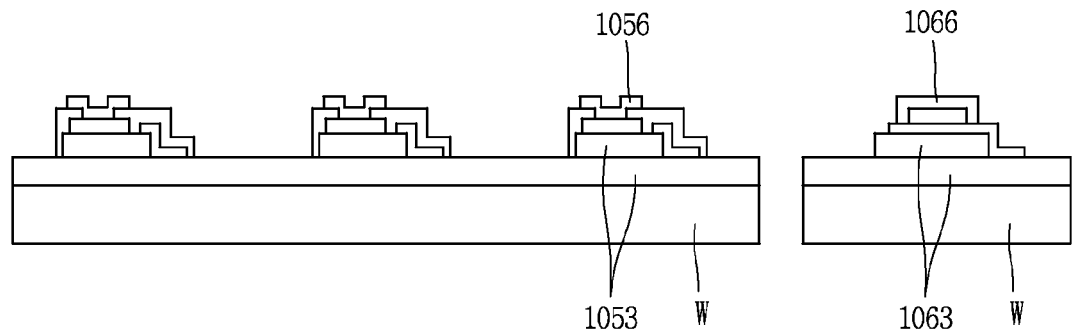

Hereinafter, a structure of the connection part 1060 and the semiconductor light emitting devices 1050 will be explained first. Then, an electrical connection passage among the semiconductor light emitting devices, the first wiring line 1020, the second wiring line 1040, the connection part 1060, the connection line 1070 and the driving part, and a structure to implement such an electrical connection passage will be explained in more detail. In particular, FIGS. 11A and 11B are sectional views illustrating a structure of the semiconductor light emitting device and the connection part according to an embodiment of the present invention, and FIGS. 12A and 12B are conceptual views illustrating a structure where the semiconductor light emitting device and the connection part are grown on the substrate according to an embodiment of the present invention.

A structure of the semiconductor light emitting devices 1050 will be explained with reference to FIG. 11A. The semiconductor light emitting device 1050 includes a first conductive semiconductor layer (e.g., a p-type semiconductor layer) 1055, and a second conductive semiconductor layer (e.g., an n-type semiconductor layer) 1053 overlapped with the first conductive semiconductor layer 1055. Further, the semiconductor light emitting device 1050 includes an active layer 1054 disposed between the first conductive semiconductor layer 1055 and the second conductive semiconductor layer 1053. In this instance, a first conductive electrode 1056 may be disposed on the first conductive semiconductor layer 1055, and a second conductive electrode 1052 may be disposed on the second conductive semiconductor layer 1053.

The active layer 1054 is provided with a first surface and a second surface. The first surface is disposed to face the first conductive semiconductor layer 1055, and the second surface is disposed to face the second conductive semiconductor layer 1053. In this instance, the first conductive semiconductor layer 1055 is formed on one surface of the active layer 1054.

The semiconductor light emitting device 1050 may include an insulating part 1058 formed to cover the second conductive electrode 1052. The insulating part 1058 may be formed to cover part of the first conductive semiconductor layer 1055, together with the second conductive electrode 1052. In this instance, the first conductive electrode 1056 may be formed at the first conductive semiconductor layer 1055 which is exposed to the outside without being covered by the insulating part 1058.

More specifically, the second conductive electrode 1052 and the active layer 1054 are formed on one surface of the second conductive semiconductor layer 1053, and they are spaced from each other in one direction with the insulating part 1058 being disposed therebetween. The one direction (horizontal direction) may be a width direction of the semiconductor light emitting device, and a vertical direction may be a thickness direction of the semiconductor light emitting device. Since the first conductive electrode 1056 and the second conductive electrode 1052 are spaced from each other by the insulating part 1058, an n-type electrode and a p-type electrode of the semiconductor light emitting device are insulated from each other.

Referring to FIGS. 12A and 12B, in the semiconductor light emitting device having such a structure, the second conductive electrode 1052 is extended toward neighboring semiconductor light emitting devices so as to be electrically-connected to the neighboring semiconductor light emitting devices. In the display device 1000 according to an embodiment of the present invention, the plurality of semiconductor light emitting devices arranged in each column may be electrically-connected to the driving part. This can reduce processes for fabricating a semiconductor light emitting device, and an additional wiring process for forming a scan electrode.

In this instance, the second conductive electrode 1052 is electrically-connected to neighboring semiconductor light emitting devices, and then is extended toward the connection part 1060. With such a structure, the connection line 1070 may be deposited or printed on the second conductive semiconductor layer 1053 together with the second conductive electrode 1052, thereby being integrally formed with the second conductive electrode 1052. The second conductive electrode 1052 may be formed as an ohmic electrode for ohmic contact.

Referring to FIG. 11B, the connection part 1060 is formed by being grown together when the semiconductor light emitting devices 1050 are grown on a wafer. Thus, the connection part 1060 electrically-connects the plurality of semiconductor light emitting devices with the wiring substrate. For this, the connection part 1060 is provided with the first conductive electrode 1056, the second conductive electrode 1052, and a plurality of layers corresponding to the second conductive semiconductor layer 1053.

For instance, the connection part 1060 includes a semiconductor layer 1063, a first conductive layer 1066 and a second conductive layer 1062. The semiconductor layer 1063 may be formed of the same material as the second conductive semiconductor layer 1053 (n-type semiconductor layer). In this instance, the semiconductor layer 1063 and the second conductive semiconductor layer 1053 may be nitride semiconductor layers such as an n-type gallium nitride (n-Gan), so as to be grown together on a substrate (semiconductor wafer). Referring to FIGS. 12A and 12B, the semiconductor layer 1063 and the second conductive semiconductor layer 1053 may be disposed on a growth substrate in the form of an n-type gallium nitride (n-Gan) laminated on an undoped gallium nitride (u-Gan). The undoped gallium nitride (u-Gan) may be removed later.

The semiconductor layer 1063 and the second conductive semiconductor layer 1053 are grown together on the growth substrate so as to have the same height. Further, the first conductive layer 1066 is formed of the same material as the first conductive electrode 1056, and the second conductive layer 1062 is formed of the same material as the second conductive electrode 1052. Thus, the connection part 1060 can be grown together with the semiconductor light emitting devices 1050.

As shown, the second conductive electrode 1052 extends toward neighboring semiconductor light emitting devices so as to be electrically-connected to the neighboring semiconductor light emitting devices. Then, the second conductive electrode 1052 is connected to the second conductive layer 1062. More specifically, the plurality of semiconductor light emitting devices 1050 are disposed to form a light emitting device array, and the second conductive electrode 1052 is provided with the connection line 1070 which forms a line by being extended along the light emitting device array. In this instance, the connection part 1060 may be disposed at the end of the connection line 1070.

For such a structure, the second conductive electrode 1052 is provided with an extension part 1059 extended so as to be protruded from a side surface of the second conductive semiconductor layer 1053. The connection line 1070 is formed in a direction perpendicular to an extended direction of the extension part 1059, thereby electrically-connecting the extension parts 1059 of the neighboring semiconductor light emitting devices with each other.

At the connection part 1060, the second conductive layer 1062 may be provided with a protrusion 1069, and the protrusion 1069 may be connected to the connection line 1070. The protrusion 1069 may be connected to the connection line 1070 by being protruded from a side surface of the semiconductor layer 1063. With such a structure, the second conductive electrode 1052, the connection line 1070, the second conductive layer 1062 and the first conductive layer 1066 can be connected to each other sequentially, thereby forming a conducting path.

In this instance, a third insulating part 1068 formed of the same material as the insulating part 1058 may be formed at the connection part 1060. The third insulating part 1068 may be formed so as to be covered by the second conductive layer 1062 corresponding to the second conductive electrode 1052, and so as to cover the first conductive layer 1066 corresponding to the first conductive electrode 1056.

In addition, the third insulating part 1068 may be formed so as to cover only part of the second conductive layer 1062 so that at least part of the first conductive layer 1066 can directly contact the second conductive layer 1062. In addition, the first conductive layer 1066 is laminated on the third insulating part 1068 so as to cover side surfaces of the third insulating part 1068. The part of the first conductive layer 1066, which covers the side surfaces of the third insulating part 1068, is electrically-connected to the second conductive layer 1062. Also, the first conductive layer 1066 is electrically-connected to the second conductive layer 1062 in a laminated state on the third insulating part 1068. Further, the insulating part 1058 covers the second conductive electrode 1052 and part of the first conductive semiconductor layer 1055 in the semiconductor light emitting device. As the two structures are combined with each other, the connection part 1060 has the same or similar height as/to the semiconductor light emitting device 1050.

As the aforementioned semiconductor light emitting devices and connection parts are attached to the wiring substrate of FIGS. 10A and 10B, the semiconductor light emitting devices, the wiring lines provided on the wiring substrate, and the driving parts connected to the wiring lines can be electrically-connected to each other.

In addition, if a distance between the connection part 1060 and the wiring substrate 1010 is significantly different from a distance between the semiconductor light emitting device 1050 and the wiring substrate 1010, a conductive material (or conductive balls) included in the conductive adhesive layer 1030 may not be transformed at a relatively farther side. In this instance, if a distance between the connection part 1060 and the wiring substrate 1010 is greater than a distance between the semiconductor light emitting device 1050 and the wiring substrate 1010, the second wiring line 1040 and the connection part 1060 provided at the wiring substrate 1010 may not be electrically-connected to each other.

In this embodiment, the connection part is formed as the second conductive layer, and the third insulating part and the first conductive layer are sequentially laminated on the semiconductor layer. Thus, a conductive material (or conductive balls) arranged between the connection part 1060 and the second wiring line 1040 may be transformed together with a conductive material (or conductive balls) arranged between the semiconductor light emitting device and the first wiring line 1020. With such a structure, the second wiring line 1040 and the connection part 1060 can be electrically-connected to each other.

With such a lamination structure, a lower surface of the first conductive electrode 1056 farthest from the second conductive semiconductor layer 1053, and a lower surface of the first conductive layer 1066 farthest from the second conductive semiconductor layer 1053 can be formed on the same plane (or almost the same plane). The first wiring line 1020 and the second wiring line 1040 may also be formed on the wiring substrate 1010 with the same thickness.

Thus, a distance between the first wiring line 1020 and the first conductive electrode 1056 of the wiring substrate, and a distance between the second wiring line 1040 and the first conductive layer 1066 of the connection part may be similar to each other or may be the same. With such a structure, an electrical connection between the wiring substrate and the semiconductor light emitting device using the conductive adhesive layer 1030 has reliability. Further, in the display device of an embodiment of the present invention, the wiring processes can be simplified.

In a display device to which a flip-chip type semiconductor light emitting device has been applied, first and second electrodes are disposed on the same plane. This may cause a difficulty in implementing a fine pitch. Further, in a display device to which a vertical-type semiconductor light emitting device has been applied, an etching process and a vacuum process for formation of an ohmic electrode should be performed. Embodiments of the present invention solve such problems.

Hereinafter, a method for manufacturing a display device including a semiconductor light emitting device having the aforementioned structure will be explained in more detail with reference to the attached drawings. In particular, FIGS. 13A to 13F and FIGS. 14A to 14D are conceptual views illustrating a method for manufacturing a display device according to an embodiment of the present invention.

Figure 13A:
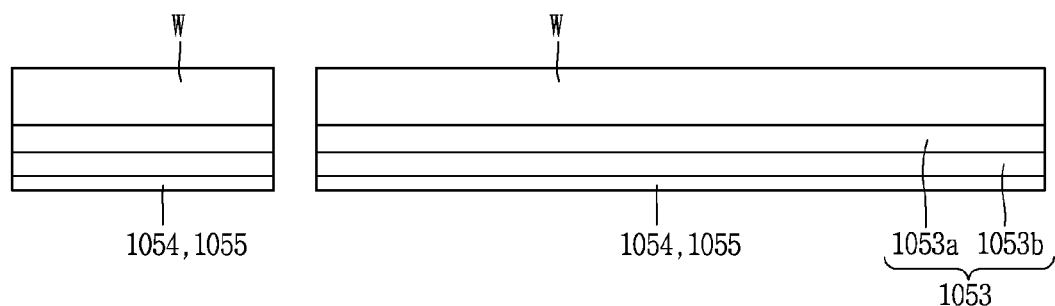
FIGS. 13A to 13F and FIGS. 14A to 14D are conceptual views illustrating a method for manufacturing a display device according to an embodiment of the present invention.

Firstly, the second conductive semiconductor layer 1053, the active layer 1054, and the first conductive semiconductor layer 1055 are grown on a growth substrate (W, or a semiconductor wafer) (refer to FIG. 13A). After the second conductive semiconductor layer 1053 is grown, the active layer 1054 is grown on the first conductive semiconductor layer 1052, and then the first conductive semiconductor layer 1055 is grown on the active layer 1054. Once the second conductive semiconductor layer 1053, the active layer 1054 and the first conductive semiconductor layer 1055 are grown sequentially, the second conductive semiconductor layer 1053, the active layer 1054 and the first conductive semiconductor layer 1055 form a laminated structure as shown.

The growth substrate (W) may include a light-transmissive material. For instance, the growth substrate (W) may include one of sapphire ($Al_2O_3$), GaN, ZnO and AlO.

However, the present invention is not limited to this. The growth substrate (W) may be formed as a carrier wafer formed of a material suitable for growing a semiconductor material. Alternatively, the growth substrate (W) may be formed of a material having an excellent thermal conductivity. As the growth substrate (W), not only a conductive substrate or an insulating substrate, but also an SiC substrate having a larger thermal conductivity than a sapphire ($Al_2O_3$) substrate may be used. Alternatively, the growth substrate (W) may be formed of at least one of Si, GaAs, GaP, InP and $Ga_2O_3$. In addition, the second conductive semiconductor layer 1053, an n-type semiconductor layer, may be a nitride semiconductor layer such as n-Gan. The second conductive semiconductor layer 1053 may include u-Gan.

Next, an etching process is performed for separating a p-type semiconductor and an n-type semiconductor from each other. For instance, referring to FIG. 13B, at least part of the first conductive semiconductor layer 1055 and the active layer 1054 is etched, thereby dividing the first conductive semiconductor layer 1055 into a plurality of regions (Mesa etching). In this instance, the active layer 1054 and the first conductive semiconductor layer 1055 are partially removed in a vertical direction, so that the second conductive semiconductor layer 1053 is exposed to the outside.

Through the etching, the plurality of semiconductor layers form an array. A region, where the aforementioned connection part is to be arranged, is formed at a position spaced from the array. For instance, the first conductive semiconductor layer 1055 and the active layer 1054 are entirely etched at the region where the aforementioned connection part is to be arranged, so that only the second conductive semiconductor layer 1055 remains.

Figure 13B:
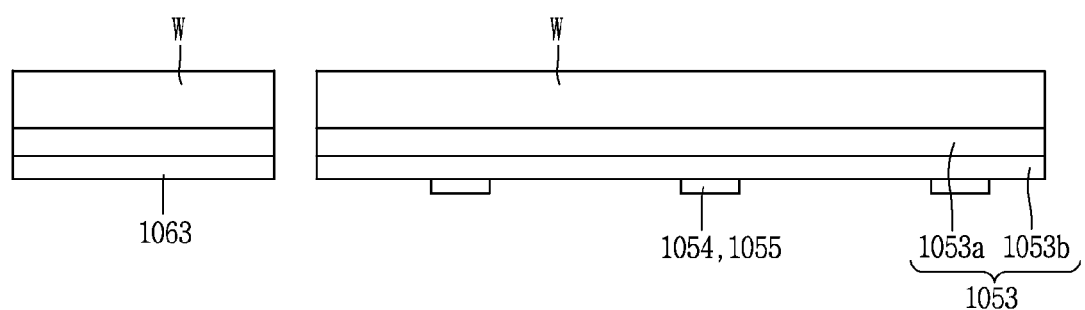
Figure 13C:
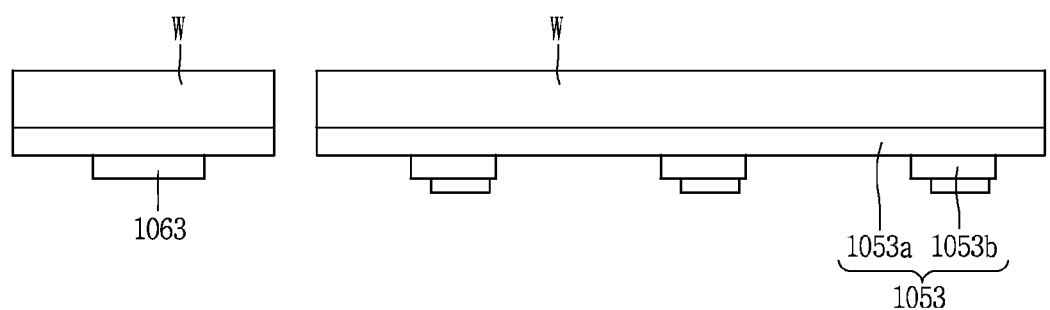
Figure 13D:
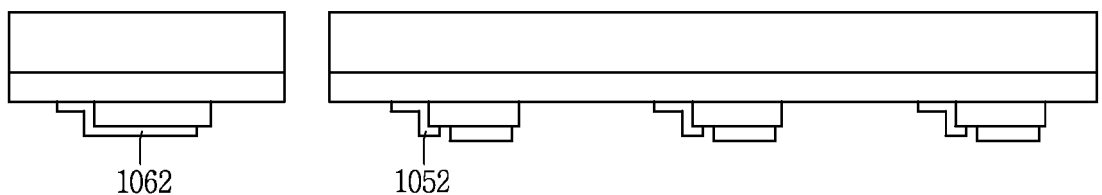

Next, a plurality of semiconductor light emitting devices isolated from each other are formed on the substrate by an etching process (refer to FIG. 13C). In this instance, a peripheral region is etched so that the region where the connection part is to be arranged can be isolated on the substrate. The region where the connection part is to be arranged is the aforementioned semiconductor layer 1063, and is formed of the same material as the second conductive semiconductor layer 1053. In this instance, the second conductive semiconductor layer 1053 has a structure where an n-Gan layer 1053b is laminated on a u-Gan layer 1053a. The etching may be performed until the u-Gan layer 1053a is exposed to the outside.

Next, a first conductive electrode and a second conductive electrode are laminated on the first conductive semiconductor layer and the second conductive semiconductor layer, respectively. Then, the connection part is formed at a position spaced from the plurality of semiconductor light emitting devices (refer to FIGS. 13D to 13F). In this instance, a step of forming the plurality of semiconductor light emitting devices and the connection part may include first to third steps.

The first step may be forming a semiconductor layer formed of the same material as the second conductive semiconductor layer at a position spaced from the plurality of semiconductor light emitting devices (refer to FIG. 13B). The second step may be forming the second conductive layer so as to overlap the semiconductor layer by being extended from the second conductive electrode, when the second conductive electrode is laminated, such that a conducting path connected from the second conductive semiconductor layer to the semiconductor layer is formed (refer to FIG. 13D). The third step may be forming the first conductive layer on the second conductive layer when the first conductive electrode is laminated (refer to FIG. 13F).

More specifically, the first conductive electrode 1056 can be laminated on the first conductive semiconductor layer 1055, and the second conductive electrode 1052 can be laminated on the second conductive semiconductor layer 1053. For implementation of a flip-chip type semiconductor light emitting device, the first conductive electrode 1056 and the second conductive electrode 1052 can be disposed at the first conductive semiconductor layer 1055 and the second conductive semiconductor layer 1053, respectively, in a spaced manner in a horizontal direction.

Further, the second conductive electrode 1052 is printed or deposited on the second conductive semiconductor layer 1053. As aforementioned, the second conductive electrode 1052 electrically-connects a plurality of semiconductor light emitting devices arranged in one direction of the light emitting device array (e.g., a column direction), with each other. In addition, the second conductive electrode 1052 is connected to the aforementioned connection part.

In this instance, the second conductive electrode 1052 may be formed to extends up to the semiconductor layer 1063. Further, the same material as the second conductive electrode 1052 may be laminated on the semiconductor layer 1063 thereby forming the aforementioned second conductive layer 1062. An electrode line formed of the same material as the second conductive electrode 1052 may be formed between the second conductive semiconductor layer 1053 and the semiconductor layer 1063 (e.g., part where u-Gan is exposed to the outside), for electrical connection between the second conductive semiconductor layer 1053 and the semiconductor layer 1063.

Figure 13E:
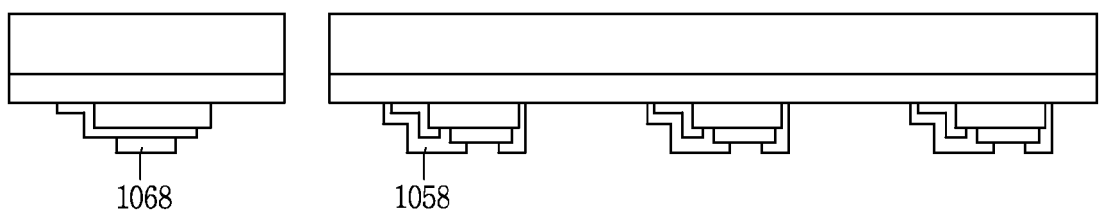
Figure 13F:
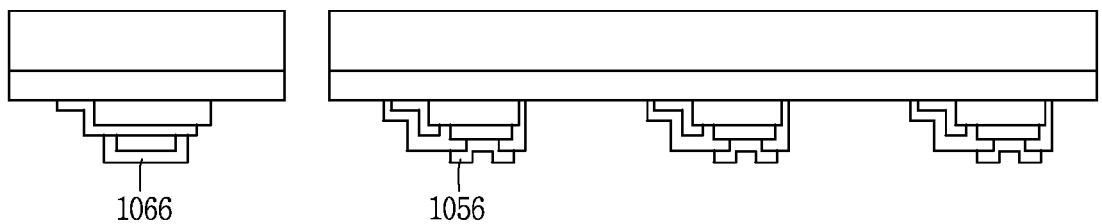

Next, an insulator is applied where the second conductive electrode 1052 and the second conductive layer 1062 have been formed, thereby forming the insulating part 1058 (refer to FIG. 13E). The second conductive electrode 1052 and the activation layer 1054 are formed on one surface of the second conductive semiconductor layer 1053, and are spaced from each other in a horizontal direction where the insulating part 1058 is interposed therebetween. The plurality of semiconductor light emitting devices, which form a light emitting device array, may be arranged so as to be distant from neighboring semiconductor light emitting devices with a predetermined space therebetween.

The predetermined space formed between the semiconductor light emitting devices may be filled with the insulating part 1058. That is, the insulating part 1058 may serve as a barrier by being disposed between the semiconductor light emitting devices. In this instance, the insulating part 1058 may be covered by only an array region of the semiconductor light emitting devices. Further, the insulating part 1058 is formed not to cover part of the first conductive semiconductor layer 1055, for electrical connection between the first conductive electrode 1056 and the first conductive semiconductor layer 1055.

A material, formed of the same material as the insulating part 1058, may be laminated on only part of the second conductive layer 1062, at a region rather than the array region. With such a configuration, the third insulating part 1068 is formed at the connection part 1060. Next, the first conductive electrode 1056 is laminated on the insulating part 1058, and part of the first conductive semiconductor layer 1055 not covered by the insulating part 1058 (refer to FIG. 13F). In this instance, the same material as the first conductive electrode 1056 may be laminated on the third insulating part 1068, and part of the second conductive layer 1062 not covered by the third insulating part 1068. As a result, the aforementioned first conductive layer 1066 may be formed.

Through such processes, a structure of the semiconductor light emitting device and the connection part formed on the wafer shown in FIGS. 12A and 12B may be implemented. Next, the connection part is connected to the wiring substrate so that the second conductive electrode 1052 can serve as a scan electrode at the display device 1000 (refer to FIGS. 14A to 14D). In this instance, the wiring substrate may be the wiring substrate aforementioned with reference to FIGS. 10A and 10B. Thus, the first wiring line 1020 and the second wiring line 1040 may be formed on one surface (the same surface) of the wiring substrate 1010, respectively.

Figure 14A:
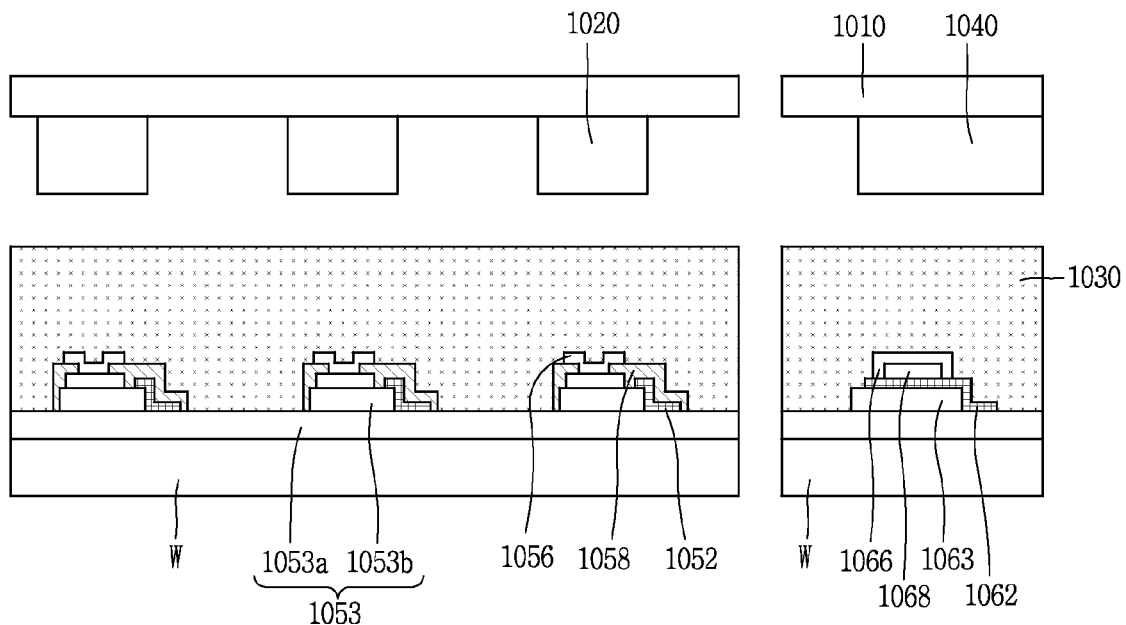
Figure 14B:
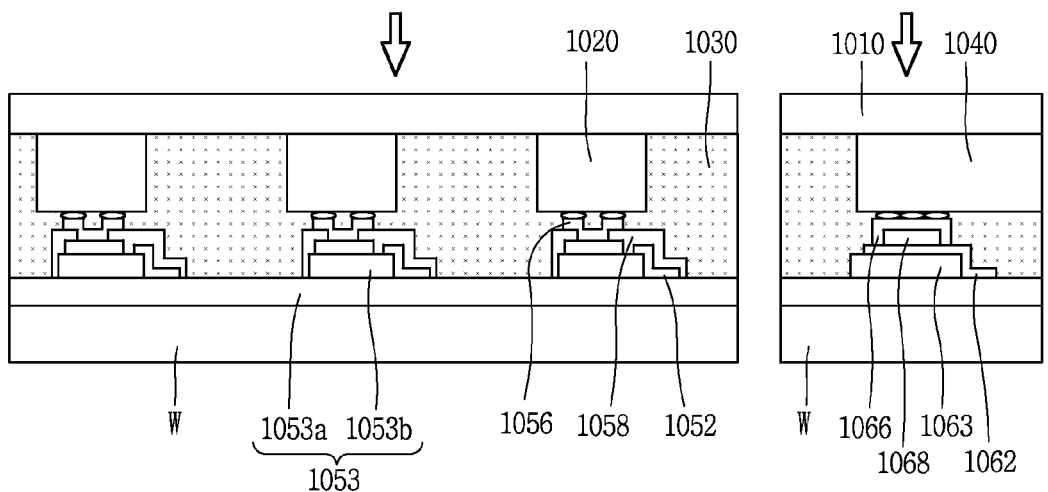

Firstly, the conductive adhesive layer 1030 is formed on the wiring substrate (refer to FIG. 14A). That is, the conductive adhesive layer 1030 is formed on the substrate 1010 where the first wiring line 1020 and the second wiring line 1040 are located. As aforementioned, the conductive adhesive layer 1030 may be configured as an anisotropy conductive film (ACF), an anisotropy conductive paste, a solution containing conductive particles, etc. In this embodiment, the conductive adhesive layer 1030 is configured as an anisotropy conductive film (ACF).

Then, the semiconductor light emitting device and the connection part formed on the wiring substrate 1010 and the growth substrate are aligned to each other, such that the first wiring line 1020 and the second wiring line 1040 face the first conductive electrode and the connection part, respectively. Then, the semiconductor light emitting device and the connection part formed on the wiring substrate and the growth substrate are thermally-compressed (refer to FIG. 14B).

For instance, the wiring substrate and the growth substrate may be thermally-compressed by using an ACF press head. The wiring substrate and the growth substrate are bonded to each other by the thermal compression. Due to characteristics of an anisotropy conductive film having conductivity by thermal compression, conductivity is implemented only between the first wiring line 1020 and the first conductive electrode, and between the second wiring line 1040 and the connection part. With such a structure, the data electrode, the scan electrode and the semiconductor light emitting device may be electrically-connected to each other. In this instance, the semiconductor light emitting device and the connection part may be inserted into the anisotropy conductive film. As a result, a partition wall may be formed between the semiconductor light emitting devices 1050.

Figure 14C:
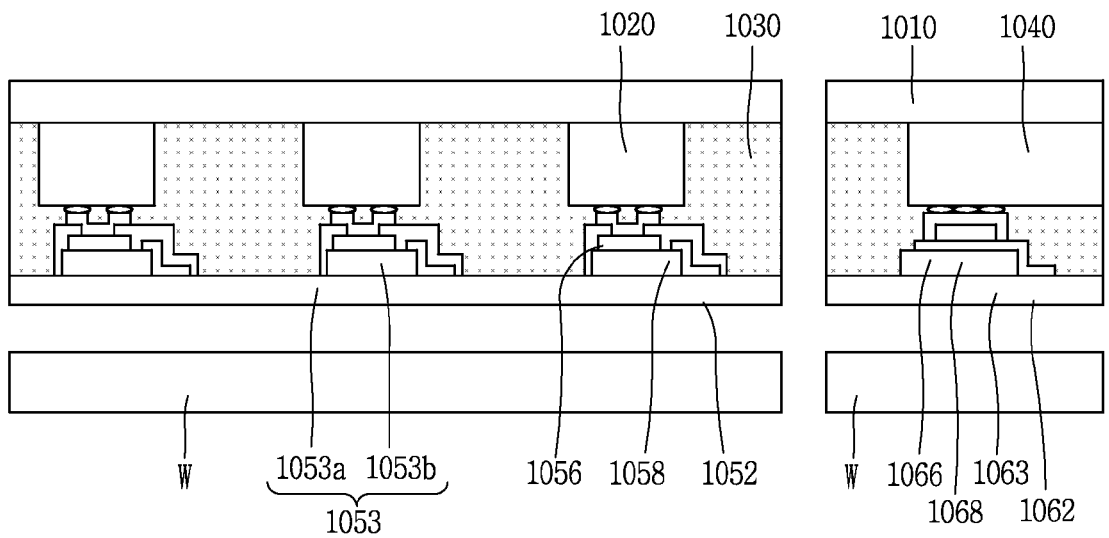

Then, the growth substrate is removed (refer to FIG. 14C). For instance, the growth substrate may be removed by a laser lift-off (LLO) method, or a chemical lift-off (CLO) method. If necessary, a transparent insulating layer may be formed by coating silicon oxide (SiOx), etc. on the wiring substrate to which the semiconductor light emitting device 1050 has been coupled. In this instance, the extension part 1059 of the second conductive electrode 1052, the connection line 1070, and the protrusion 1063 of the second conductive layer 1062 are covered by the u-Gan layer 1053a of the second conductive semiconductor layer 1053, so that they can be protected from a laser generated during a laser lift-off (LLO) method.

Figure 14D:
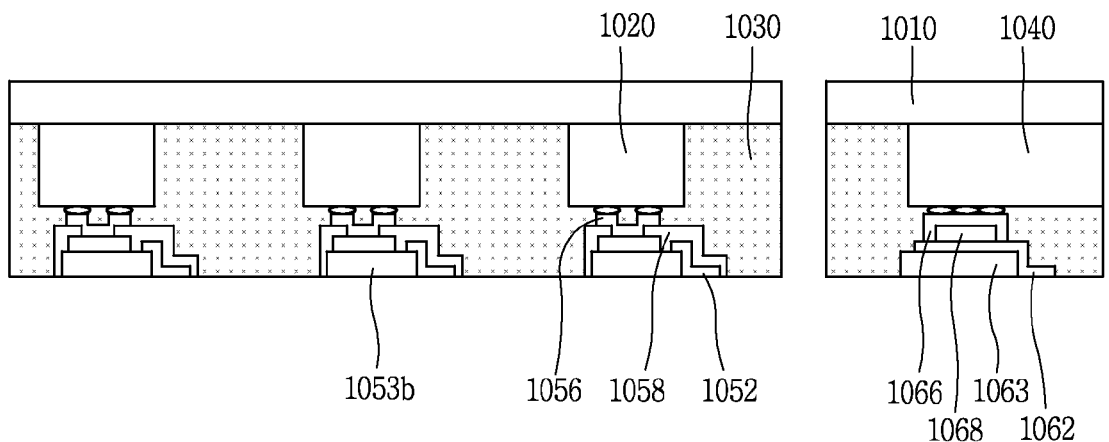

Finally, a u-Gan layer laminated on the second conductive electrode 1052 and the second conductive layer 1062, and a u-Gan layer disposed between the second conductive electrode 1052 and the second conductive layer 1062 are removed by an etching process (refer to FIG. 14D). The method for manufacturing a display device may further include forming a phosphor layer on one surface of the semiconductor light emitting device 1050. For instance, the semiconductor light emitting device 1050 may be a blue semiconductor light emitting device for emitting blue (B) light. A red phosphor or a green phosphor for converting the blue (B) light into a color of a unit pixel may form a layer on one surface of the blue semiconductor light emitting device.

According to the manufacturing method, the connection part connected to the wiring substrate and having a post shape is manufactured when the semiconductor light emitting device is grown and the n-electrode is formed. This can simplify wiring processes. So far, a structure has been explained where the second conductive electrode extends from an array of the semiconductor light emitting devices to thus be connected to the connection part. However, the structure may be modified in various manners. For instance, the conducting path, connected from the second conductive semiconductor layer of the semiconductor light emitting device, to the semiconductor layer of the connection part, can be reinforced. This will be explained in more detail with reference to FIG. 15.

Figure 15:
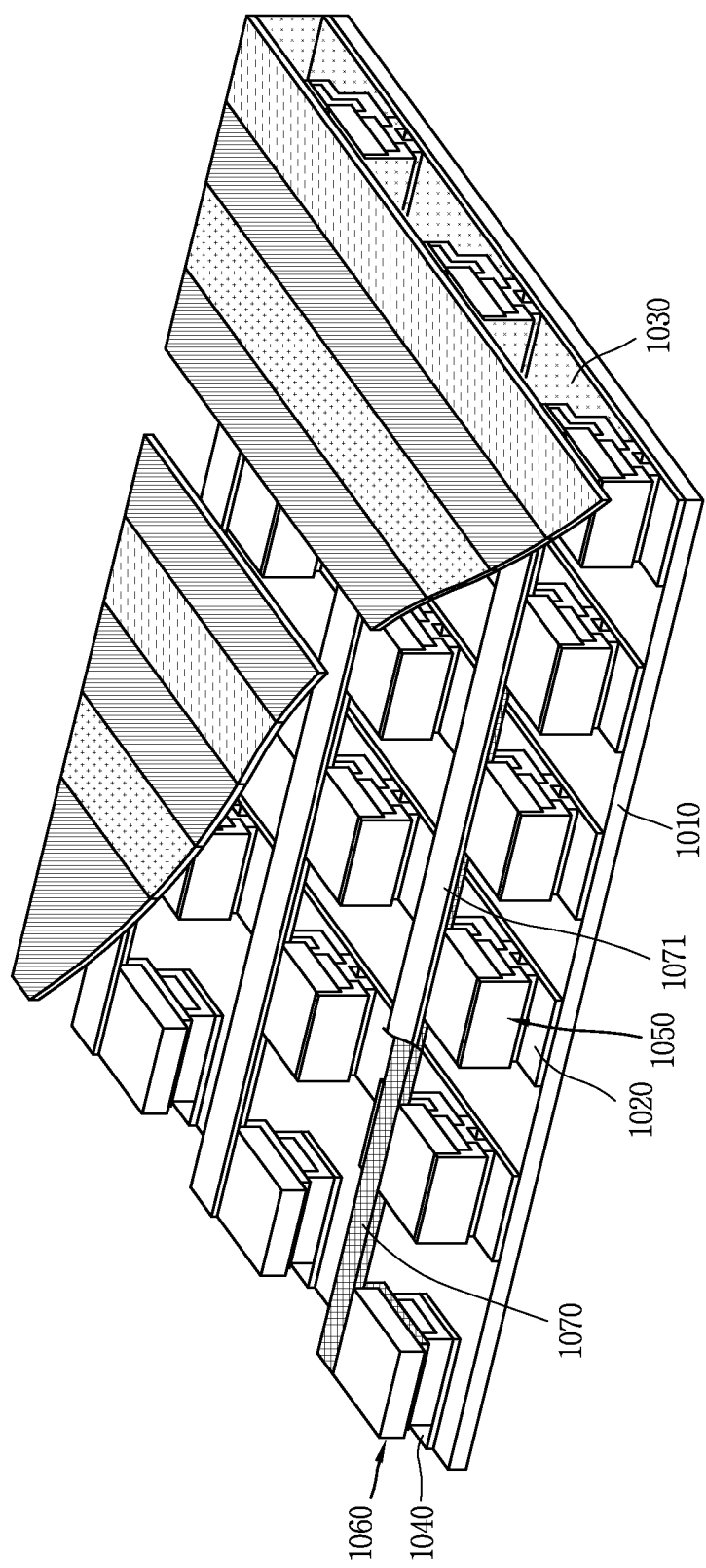
FIG. 15 is a perspective view of a display device according to another embodiment of the present invention.

In particular, FIG. 15 is a perspective view of a display device according to another embodiment of the present invention. A horizontal-type semiconductor light emitting device according to this embodiment includes a first conductive semiconductor layer 1055 formed on an active layer 1054, and a first conductive electrode 1056 formed on the first conductive semiconductor layer 1055. The active layer 1054 is formed on a second conductive semiconductor layer 1053, and a second conductive electrode 1057 is formed on the second conductive semiconductor layer 1053. The structure of the horizontal-type semiconductor light emitting device is the same as that of the horizontal-type semiconductor light emitting device aforementioned with reference to FIGS. 10A to 12B, and thus detailed explanations thereof will be omitted.

As shown in FIG. 15, a connection line 1070 is connected up to a connection part 1060 by being extended from the second conductive electrode 1052 of the semiconductor light emitting device, thereby electrically-connecting the semiconductor light emitting devices with the second wiring line 1040. In this instance, the connection line 1070 is covered by a conductive line 1071. That is, the conductive line 1071 is electrically-connected to the second conductive electrode 1057, the connection line 1070, and the second conductive layer 1062, respectively.

The conductive line 1071 may connect the neighboring semiconductor light emitting devices 1050 with each other, in a direction perpendicular to the first wiring line 1020. Further, the conductive line 1071 may be formed of a transparent material, and may have conductivity. The conductive line 1071 may also be configured as a transparent electrode. Further, the conductive line 1071 may be formed by a thin film wiring process and a printing wiring process.

More specifically, the first wiring line 1020 may electrically-connect the neighboring semiconductor light emitting devices 1050 in an F-F direction of FIG. 10B, and the conductive line 1071 may electrically-connect the neighboring semiconductor light emitting devices 1050 in an E-E direction perpendicular to the first wiring line 1020 of FIG. 10B. In this instance, the conductive line 1071 may be formed to completely cover the connection line 1070.

In addition, the conductive line 1071 may be formed when a driving current is greater than a reference value, and may play an auxiliary role of the connection line 1070. In this instance, the conductive line 1071 may be formed to have a smaller thickness than the second wiring line 1040 of the wiring substrate. This can shorten time taken to perform wiring processes.

The conducting path of the present invention is not limited to have the aforementioned structure. For instance, when the connection line 1070 and the conductive line 1071 are not additionally provided, the second conductive electrode may be extended in the form of a bar. The extended second conductive electrode may connect the neighboring semiconductor light emitting devices to each other, and then may be connected to the connection part. Hereinafter, such a structure will be explained with reference to FIG. 16.

Figure 16:
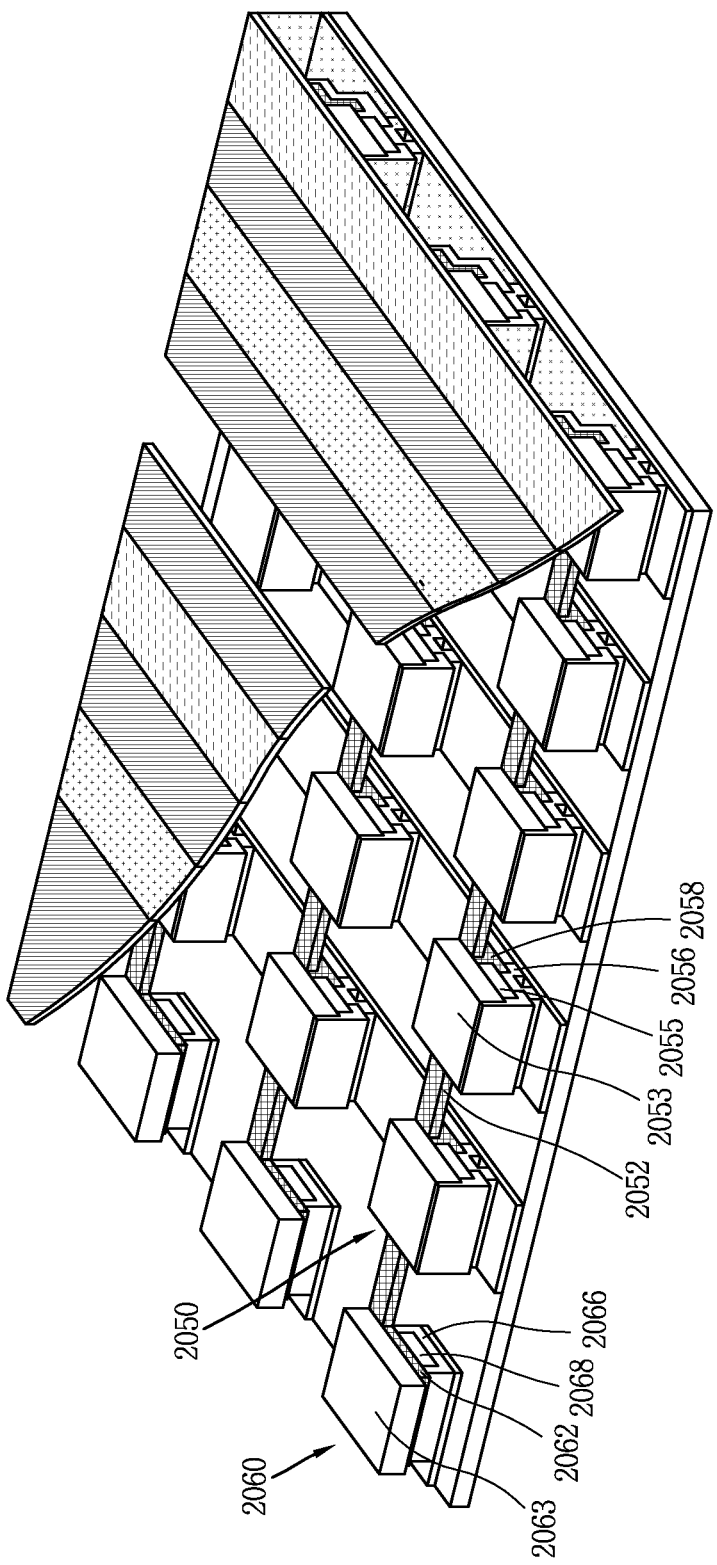
FIG. 16 is a perspective view of a display device according to still another embodiment of the present invention.

In particular, FIG. 16 is a perspective view of a display device according to still another embodiment of the present invention. As shown, a second conductive electrode 2052 of a semiconductor light emitting device is configured as an electrode line for electrically-connecting a plurality of semiconductor light emitting devices arranged in one direction (e.g., a column direction) of a light emitting device array, with each other. That is, the second conductive electrode 2052 is configured as an electrode line, without the connection line or the conductive line provided in the aforementioned embodiment.

With such a structure, a plurality of semiconductor light emitting devices 2050 arranged in each column of the light emitting device array may share the second conductive electrode 2052. The second conductive electrode 2052 is formed so as to extend from one semiconductor light emitting device to at least one neighboring semiconductor light emitting device, so as to electrically-connect the plurality of semiconductor light emitting devices 250 adjacent to each other in each column.

The second conductive electrode 2052, configured to electrically-connect the plurality of semiconductor light emitting devices arranged in a column direction with each other, may serve as a scan electrode in a display device as aforementioned. That is, the second conductive electrode 2052 serves as a scan electrode of a display device, and serves as an n-type electrode of a semiconductor light emitting device. In this instance, a first conductive electrode 2056, a p-type electrode of the aforementioned semiconductor light emitting device, is laminated on a second conductive semiconductor layer 2055. The first conductive semiconductor layer 2053 is also shown in FIG. 16.

As shown, at least part of the second conductive semiconductor layer 2055 and the second conductive electrode 2052 are covered by an insulating part 2058. A connection part 2060 is arranged at the end of the electrode line, and is electrically-connected to a second wiring line of a wiring substrate through the aforementioned manufacturing method and the structure of the wiring substrate.

In this instance, the connection part 2060 has a structure where a semiconductor layer 2063, a second conductive layer 2062, a third insulating part 2068 and a first conductive layer 2066 are sequentially laminated on each other. The second conductive layer 2062 is configured as part of the electrode line formed by the second conductive electrode 2052. The second conductive electrode 2052 is formed as a long bar having no curved line up to the second conductive layer 2062. Thus, the connection part 2060 may be disposed on a line connected from the second conductive electrode 2052. Explanations about the semiconductor layer 2063 or the third insulating part 2068 and the first conductive layer 2066 correspond to explanations about the connection part aforementioned with reference to FIGS. 10A to 12B.

In the display device according to an embodiment of the present invention, a plurality of semiconductor light emitting devices arranged in each column can be electrically-connected to a driving part, through the second conductive electrode 2052. Thus, the number of processes for manufacturing semiconductor light emitting devices can be reduced, and an additional process for forming scan electrodes can be omitted.

The display device according to an embodiment of the present invention can have the following advantages. Firstly, since the connection part connected to the wiring substrate is formed on a wafer when the semiconductor light emitting device is grown, the wiring connection can be performed without any weak connected region.

Secondly, since the connection part is together formed when the semiconductor light emitting device is grown, the connection part can be implemented as a post structure without an additional process. Thirdly, the electrode line on the wiring substrate, required for electrical connection between the semiconductor light emitting device with the connection part, can be arranged with the degree of freedom, by utilizing the connection part.

Fourthly, since the conductive electrode of the semiconductor light emitting device is connected to the connection part, a thickness of the wiring line can be reduced and a processing time can be shortened. Fifthly, since the first conductive layer and the second conductive layer are laminated on the semiconductor layer, a distance between the connection part and the wiring substrate can be made to be equal to or similar to a distance between the semiconductor light emitting device and the wiring substrate.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A display device, comprising:
    a plurality of semiconductor light emitting devices on a wiring substrate having wiring lines; and
    a connection part on the wiring substrate and configured to electrically-connect the plurality of semiconductor light emitting devices to the wiring substrate,
    wherein each of the plurality of semiconductor light emitting devices includes:
        a first conductive semiconductor layer;
        a second conductive semiconductor layer overlapped with the first conductive semiconductor layer;
        a first conductive electrode on the first conductive semiconductor layer; and
        a second conductive electrode on the second conductive semiconductor layer,
    wherein the connection part includes a first conductive layer formed of a same material as the first conductive electrode and a second conductive layer formed of a same material as the second conductive electrode,
    wherein a first wiring line is connected to the first conductive electrode of the plurality of semiconductor light emitting devices,
    wherein a second wiring line is connected to the connection part,
    wherein the first wiring line and the second wiring line are formed at the wiring substrate, and
    wherein the first wiring line extends in a first direction to a first edge of the wiring substrate and the second wiring line extends in a second direction to a second edge of the wiring substrate.

2. The display device of claim 1, wherein the connection part further includes:
    a semiconductor layer formed of a same material as the second conductive semiconductor layer.

3. The display device of claim 2, wherein the second conductive electrode extends toward a neighboring semiconductor light emitting device so as to be electrically-connected to the neighboring semiconductor light emitting device, and
    wherein the second conductive electrode is connected to the second conductive layer.

4. The display device of claim 2, wherein the semiconductor layer and the second conductive semiconductor layer are grown on a substrate together so as to have a same height.

5. The display device of claim 4, wherein the semiconductor layer and the second conductive semiconductor layer are formed as nitride semiconductors.

6. The display device of claim 1, wherein a lower surface of the first conductive electrode farthest from the second conductive semiconductor layer, and a lower surface of the first conductive layer below the second conductive semiconductor layer are formed on a same plane.

7. The display device of claim 1, wherein the plurality of semiconductor light emitting devices are arranged to form a light emitting device array,
    wherein the second conductive electrode extends along one line of the light emitting device array to thus form an electrode line, and
    wherein the connection part is arranged at an end portion of the electrode line.

8. The display device of claim 1,
    wherein the connection part is electrically-connected to the second wiring line through a conductive adhesive layer.

9. The display device of claim 8, wherein the first wiring line is connected to the first conductive electrodes of the plurality of semiconductor light emitting devices through a conductive adhesive.

10. The display device of claim 1, wherein the second wiring line is arranged at the second edge of the wiring substrate.

11. The display device of claim 1, wherein the plurality of semiconductor light emitting devices further include an insulating part covering the second conductive electrode.

12. The display device of claim 11, wherein the connection part further includes an insulating part formed of a same material as the insulating part of the semiconductor light emitting device, the insulating part being covered by the second conductive layer corresponding to the second conductive electrode and covering the first conductive layer corresponding to the first conductive electrode.

13. The display device of claim 12, wherein the insulating part of the connection part covers only part of the second conductive layer so that at least part of the first conductive layer directly contacts the second conductive layer.

14. The display device of claim 1, wherein the second conductive electrode includes an extension part protruding from a side surface of the second conductive semiconductor layer.

15. The display device of claim 14, wherein a connection line is formed in a direction perpendicular to an extended direction of the extension part, to thus electrically-connect the extension parts of the neighboring semiconductor light emitting devices with each other.

16. The display device of claim 15, wherein the second conductive layer of the connection part includes a protrusion connected to the connection line by protruding from a side surface of the second semiconductor layer.

17. The display device of claim 15, wherein the second conductive electrode, the connection line, the second conductive layer and the first conductive layer are connected to each other sequentially, to thus form a conducting path.

18. The display device of claim 17, further comprising:
a conductive line electrically-connected to the second conductive electrode, the connection line, and the second conductive layer.

19. The display device of claim 1, wherein the wiring substrate includes a flexible material, and
wherein each of the plurality of semiconductor light emitting devices is configured to emit at least one of red light, green light, blue light and ultraviolet rays.

* * * * *